(12) United States Patent
Takigawa et al.

(10) Patent No.: US 9,887,513 B2
(45) Date of Patent: Feb. 6, 2018

(54) LASER APPARATUS HAVING CONDENSATION PREVENTION FUNCTION

(71) Applicant: FANUC CORPORATION, Yamanashi (JP)

(72) Inventors: Hiroshi Takigawa, Yamanashi (JP); Akihiko Nishio, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/367,778

(22) Filed: Dec. 2, 2016

(65) Prior Publication Data

US 2017/0163005 A1 Jun. 8, 2017

(30) Foreign Application Priority Data

Dec. 4, 2015 (JP) ................. 2015-237504

(51) Int. Cl.
| | |
|---|---|
| *H01S 5/00* | (2006.01) |
| *H01S 3/04* | (2006.01) |
| *H01S 5/024* | (2006.01) |
| *H01S 3/042* | (2006.01) |
| *H01S 3/02* | (2006.01) |
| *H01S 3/00* | (2006.01) |

(52) U.S. Cl.
CPC ............ *H01S 5/0014* (2013.01); *H01S 3/042* (2013.01); *H01S 3/0407* (2013.01); *H01S 5/02423* (2013.01); *H01S 5/02453* (2013.01); *H01S 3/0014* (2013.01); *H01S 3/027* (2013.01)

(58) Field of Classification Search
CPC ............ H01S 5/0014; H01S 5/02453; H01S 5/02423; H01S 3/0407; H01S 3/027
See application file for complete search history.

(56) References Cited

U.S. PATENT DOCUMENTS

| | | | |
|---|---|---|---|
| 9,548,583 B2 | 1/2017 | Tanaka et al. | |
| 2006/0013697 A1* | 1/2006 | Uratani | ............... F04B 39/0238 417/36 |
| 2009/0141746 A1* | 6/2009 | Fujikawa | ................ H01S 3/025 372/10 |
| 2011/0182319 A1* | 7/2011 | Hua | ........................ H01S 3/134 372/55 |

FOREIGN PATENT DOCUMENTS

| | | |
|---|---|---|
| JP | 61-079285 A | 4/1986 |
| JP | 03-252199 A | 11/1991 |
| JP | 2001-326410 A | 11/2001 |
| JP | 2003-060268 A | 2/2003 |

(Continued)

*Primary Examiner* — Xinning Niu
(74) *Attorney, Agent, or Firm* — RatnerPrestia

(57) ABSTRACT

A laser apparatus that can reliably prevent the formation of condensation is disclosed. In the laser apparatus, the temperature of cooling water supplied into the interior of the laser apparatus is controlled within a first predetermined temperature range during laser oscillation, while at the same time, continuously performing dehumidification so that the relation (dew point of air inside laser apparatus)+(first predetermined temperature difference)≤(cooling water temperature) is maintained. The dew point of the air inside the laser apparatus can be obtained by a computing unit from the humidity and temperature of the air.

10 Claims, 24 Drawing Sheets

(56) References Cited

FOREIGN PATENT DOCUMENTS

| JP | 2008043889 A | 2/2008 |
|----|--------------|--------|
| JP | 2012-024778 A | 7/2010 |
| JP | 2012-024778 A | 2/2012 |
| JP | 2012034781 A | 2/2012 |
| JP | 2013239696 A | 11/2013 |

\* cited by examiner

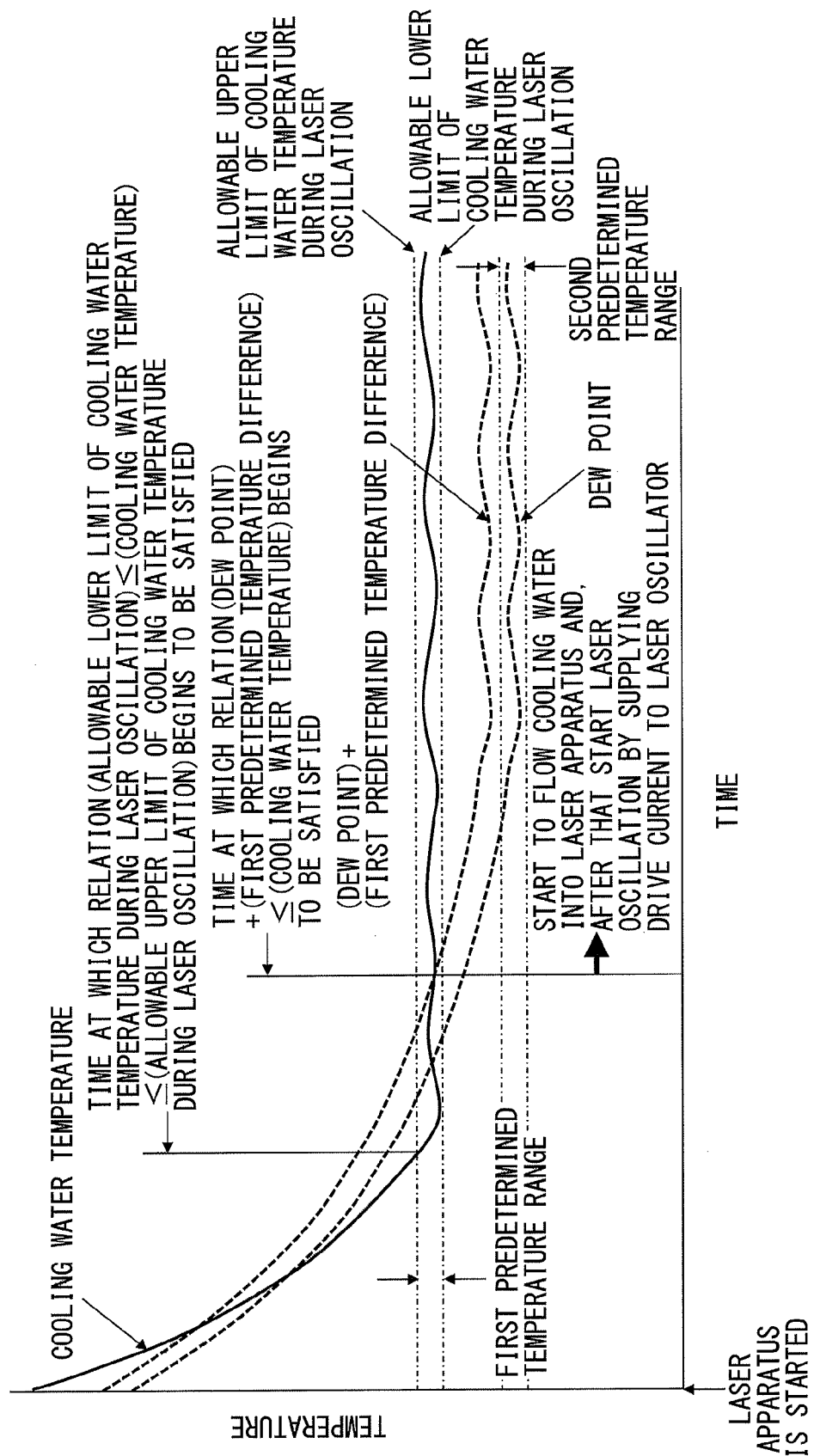

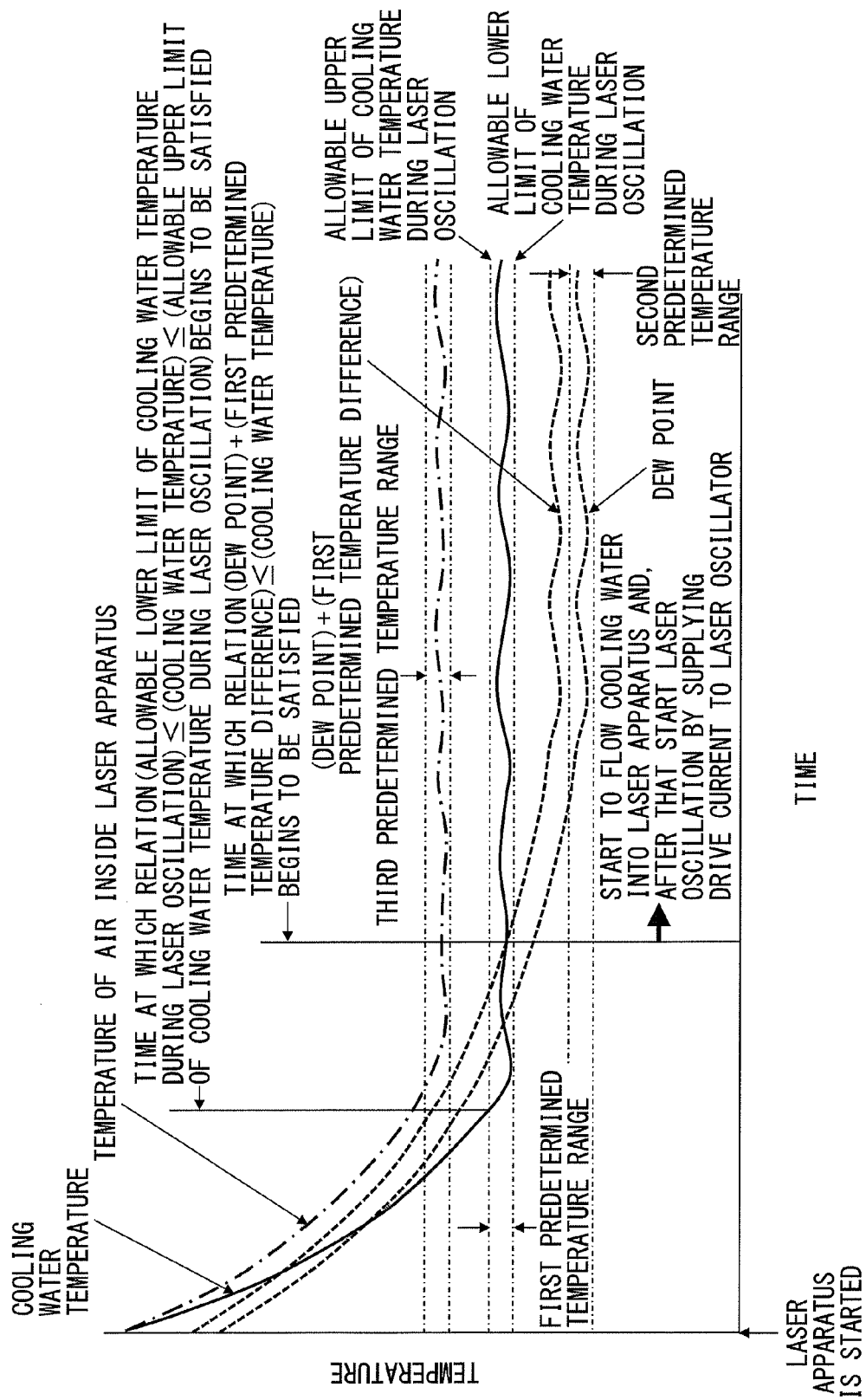

LASER APPARATUS HAVING CONDENSATION PREVENTION FUNCTION

BACKGROUND OF THE INVENTION

1. Field of the Invention

The present invention relates to a laser apparatus.

2. Description of the Related Art

Condensation may form inside a laser apparatus due to temperature variations, humidity or the like occurring inside the laser apparatus. The formation of condensation can cause electrical shorting or can lead to contamination or corrosion of components.

A variety of techniques for preventing condensation have been proposed for use with laser apparatus or other conventional electronic apparatus (refer to Japanese Unexamined Patent Publication Nos. 2001-326410, S61-079285, 2003-060268, 2012-024778, and H03-252199).

SUMMARY OF THE INVENTION

There is thus a need for a laser apparatus that can reliably prevent the formation of condensation.

According to a first invention of the present application, there is provided a laser apparatus which includes a laser oscillator and a power supply unit for supplying a driving current to the laser oscillator, and which is configured so that cooling water for cooling a heat-generating component contained in the laser apparatus is supplied from a cooling water supply apparatus provided outside the laser apparatus, wherein the laser apparatus comprises: a cabinet having hermeticity to reduce the amount of air infiltrating from outside the laser apparatus into an interior of the laser apparatus to a level not higher than a predetermined value; a dehumidifier which dehumidifies air inside the laser apparatus; a humidity detector which detects humidity of the air inside the laser apparatus; a first temperature detector which detects temperature of the air inside the laser apparatus; a second temperature detector which detects temperature of the cooling water supplied from outside the laser apparatus; a computing unit which computes dew point of the air inside the laser apparatus from detection results supplied from the humidity detector and the first temperature detector; a decision unit which makes a decision, based on the detection result from the second temperature detector and the dew point computed by the computing unit, as to whether a flow start condition for starting to flow the cooling water into the interior of the laser apparatus or an oscillation start condition for causing the laser oscillator to start laser oscillation by supplying the driving current from the power supply unit to the laser oscillator has been satisfied or not; and a control unit which, based on the result of the decision made by the decision unit, controls the opening and closing of a shutoff valve provided in a pipe through which the cooling water supplied from the cooling water supply apparatus flows, or controls the supply of the driving current from the power supply unit to the laser oscillator, and wherein the control unit is configured so that when it is decided by the decision unit that a relation (dew point)+(first predetermined temperature difference)≤(cooling water temperature) and a relation (allowable lower limit of cooling water temperature during laser oscillation)≤(cooling water temperature)≤(allowable upper limit of cooling water temperature during laser oscillation) are both satisfied as a result of a comparison between the dew point computed by the computing unit and the cooling water temperature detected by the second temperature detector, the shutoff valve provided in the pipe is opened to start to flow the cooling water into the interior of the laser apparatus and, after that the driving current is supplied to the laser oscillator to start laser oscillation, and the cooling water supply apparatus is configured to continue to supply the cooling water during the laser oscillation, the cooling water being controlled within a first predetermined temperature range defined between the allowable lower limit of the cooling water temperature during the laser oscillation and the allowable upper limit of the cooling water temperature during the laser oscillation, while on the other hand, the dehumidifier is configured to continue to dehumidify the air so during the laser oscillation so that the relation (dew point)+(first predetermined temperature difference)≤(cooling water temperature) is maintained.

According to a second invention of the present application, the dehumidifier has a dehumidifying capacity exceeding a maximum amount of moisture per unit time that can infiltrate from outside the laser apparatus into the interior of the laser apparatus, the maximum amount being estimated from an allowable environmental condition of the laser apparatus and the hermeticity provided by the cabinet to reduce the amount of air infiltrating from outside the laser apparatus into the interior of the laser apparatus to a level not higher than the predetermined value.

According to a third invention of the present application, the dehumidifier is configured to continue to dehumidify the air during a period that the cooling water is being supplied from the cooling water supply apparatus into the interior of the laser apparatus.

According to a fourth invention of the present application, the dehumidifier is controlled so that the dew point of the air inside the laser apparatus lies within a second predetermined temperature range which is lower than the first predetermined temperature range, and so that the dew point, once brought into the second predetermined temperature range, will not deviate outside the second predetermined temperature range.

According to a fifth invention of the present application, the laser apparatus further includes an air temperature regulator for regulating the temperature of the air inside the laser apparatus, wherein in response to a command from the control unit, the temperature of the air inside the laser apparatus detected by the first temperature detector is controlled by the air temperature regulator so as to lie within a third predetermined temperature range whose lower limit temperature value is set approximately equal to a lower limit temperature of the first predetermined temperature range or set higher than the lower limit temperature of the first predetermined temperature range, and once the temperature of the air inside the laser apparatus is brought into the third predetermined temperature range, the temperature of the air inside the laser apparatus is controlled so as not to deviate outside the third predetermined temperature range.

According to a sixth invention of the present application, the dehumidifier is of a type that cools the air flowing into the dehumidifier to a temperature equal to or below the dew point and dehumidifies the air by causing condensation on a condensing unit contained within the dehumidifier, and the laser apparatus further includes a heating unit for heating the air flowing out of the dehumidifier, wherein the heating unit is controlled by the control unit so as to apply substantially minimum heating necessary to prevent the temperature of the air inside the laser apparatus from dropping below the lower limit temperature of the third predetermined temperature range.

According to a seventh invention of the present application, the temperature of the air inside the laser apparatus is controlled by the air temperature regulator to a temperature within the third predetermined temperature range or to a temperature not lower than the lower limit temperature of the third predetermined temperature range, and the laser apparatus further includes a third temperature detector for detecting an outside temperature of the laser apparatus or temperature of the cabinet, wherein the third predetermined temperature range is set as a time-varying condition, and the lower limit temperature of the third predetermined temperature range is set equal to a temperature obtained by adding a second predetermined temperature difference to the lower limit temperature of the first predetermined temperature range or to a temperature obtained by subtracting a third predetermined temperature difference from the temperature detected by the third temperature detector, whichever temperature is higher, and wherein air temperature inside the laser apparatus is controlled to a temperature falling within the third predetermined temperature range or to a temperature not lower than the lower limit temperature of the third predetermined temperature range.

According to an eighth invention of the present application, the temperature of the air inside the laser apparatus is controlled by the heating unit to a temperature within the third predetermined temperature range or to a temperature not lower than the lower limit temperature of the third predetermined temperature range, and the laser apparatus further includes a third temperature detector for detecting an outside temperature of the laser apparatus or temperature of the cabinet, wherein the third predetermined temperature range is set as a time-varying condition, and the lower limit temperature of the third predetermined temperature range is set equal to a temperature obtained by adding a second predetermined temperature difference to the lower limit temperature of the first predetermined temperature range or to a temperature obtained by subtracting a third predetermined temperature difference from the temperature detected by the third temperature detector, whichever temperature is higher, and wherein air temperature inside the laser apparatus is controlled to a temperature falling within the third predetermined temperature range or to a temperature not lower than the lower limit temperature of the third predetermined temperature range.

According to a ninth invention of the present application, even during a period when a start command is not issued to the laser apparatus, except when a complete stop command is issued to the laser apparatus, the humidity and temperature of the air inside the laser apparatus are monitored at all times or at predetermined intervals of time by the humidity detector, the first temperature detector, the computing unit, the decision unit, and the control unit, and when the temperature obtained by adding the first predetermined temperature difference to the dew point of the air inside the laser apparatus becomes higher than the temperature of the air inside the laser apparatus detected by the first temperature detector, operation of the dehumidifier is started automatically to dehumidify the air.

According to a tenth invention of the present application, the laser apparatus further includes a fourth temperature detector for detecting the temperature of the cooling water inside the cooling water pipe located upstream of or at substantially the same position as the heat-generating component or for detecting temperature of a component member thermally contacting the cooling water pipe located upstream of or at substantially the same position as the heat-generating component, wherein even during a period when a start command is not issued to the laser apparatus, except when a complete stop command is issued to the laser apparatus, the temperature obtained by adding the first predetermined temperature difference to the dew point of the air is compared with the temperature detected by the fourth temperature detector and the temperature of the air inside the laser apparatus detected by the first temperature detector, and if the obtained temperature is higher than at least one of the detected temperatures, operation of the dehumidifier is started automatically to dehumidify the air.

BRIEF DESCRIPTION OF THE DRAWINGS

These and other objects, features, and advantages of the present invention will become more apparent from the detailed description of the illustrative embodiments as set forth below with reference to the accompanying drawings, wherein:

FIG. 4 is a control time chart for a laser apparatus according to a second embodiment;

FIG. 7 is a control time chart for the laser apparatus according to the third embodiment;

DETAILED DESCRIPTION

Figure 1:
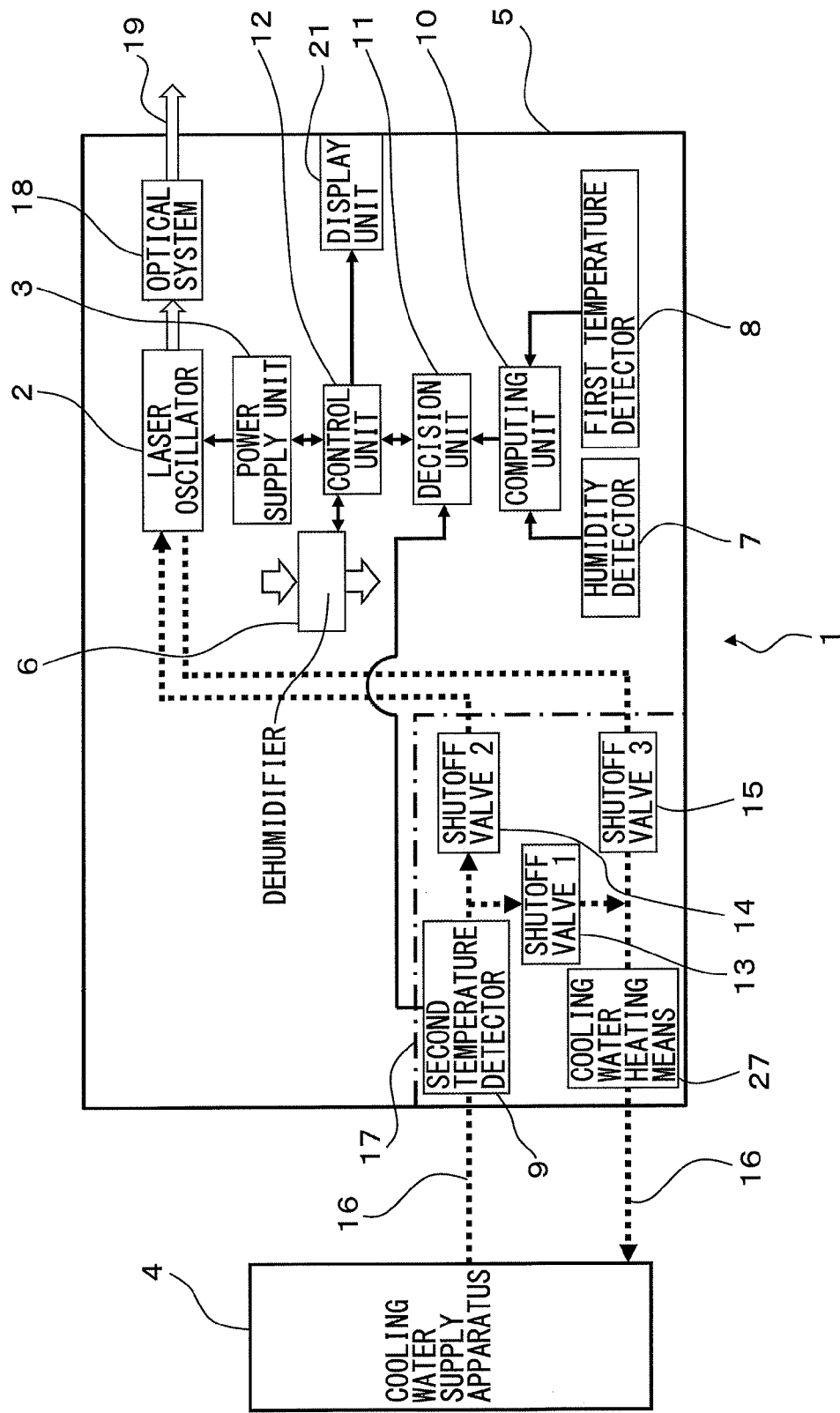
FIG. 1 is a schematic diagram showing the configuration of a laser apparatus according to a first embodiment.

Embodiments of the present invention will be described below with reference to the accompanying drawings. The same reference numerals are used to designate the same or corresponding component elements.

Figure 2:
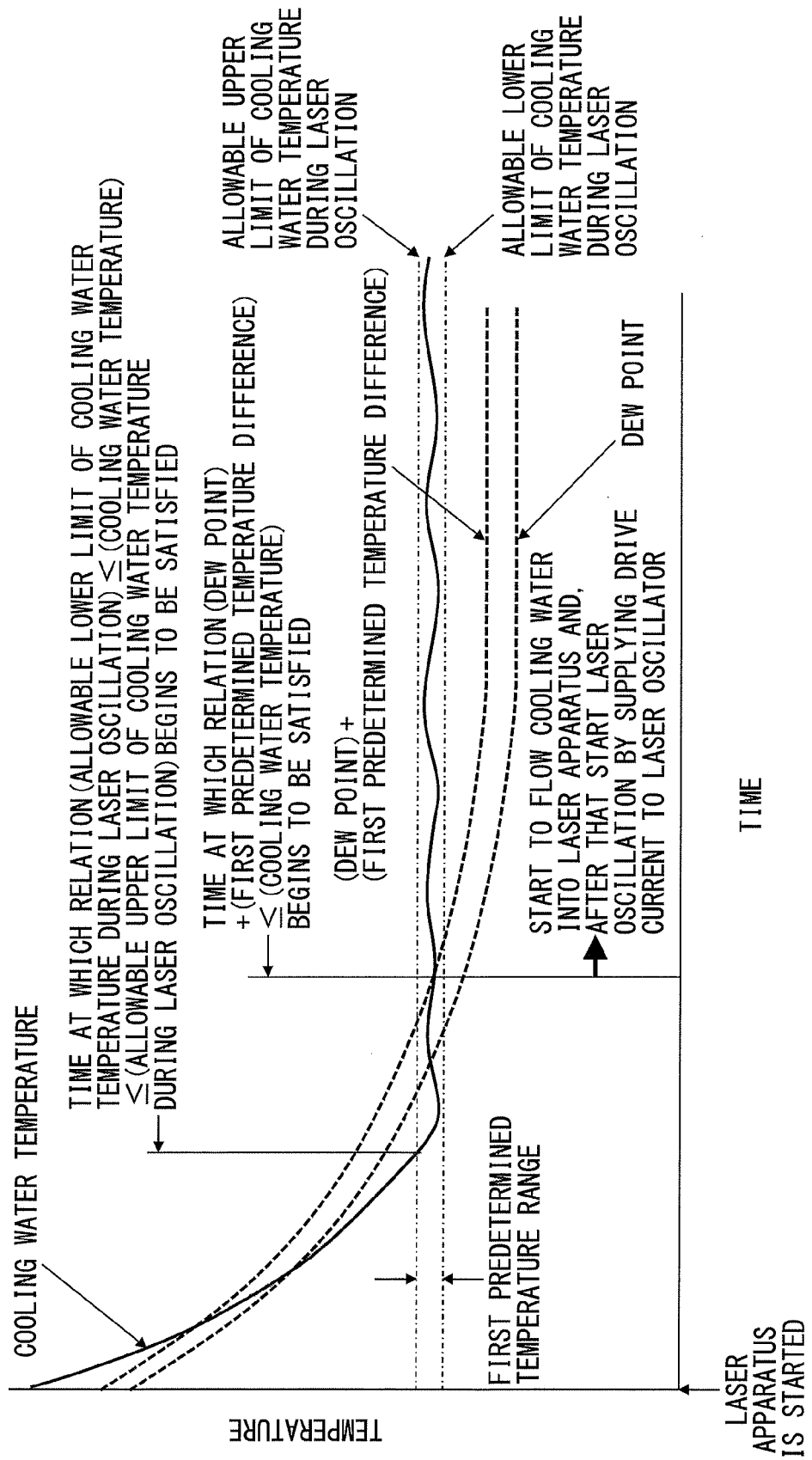
FIG. 2 is a control time chart for the laser apparatus according to the first embodiment.
Figure 3A:
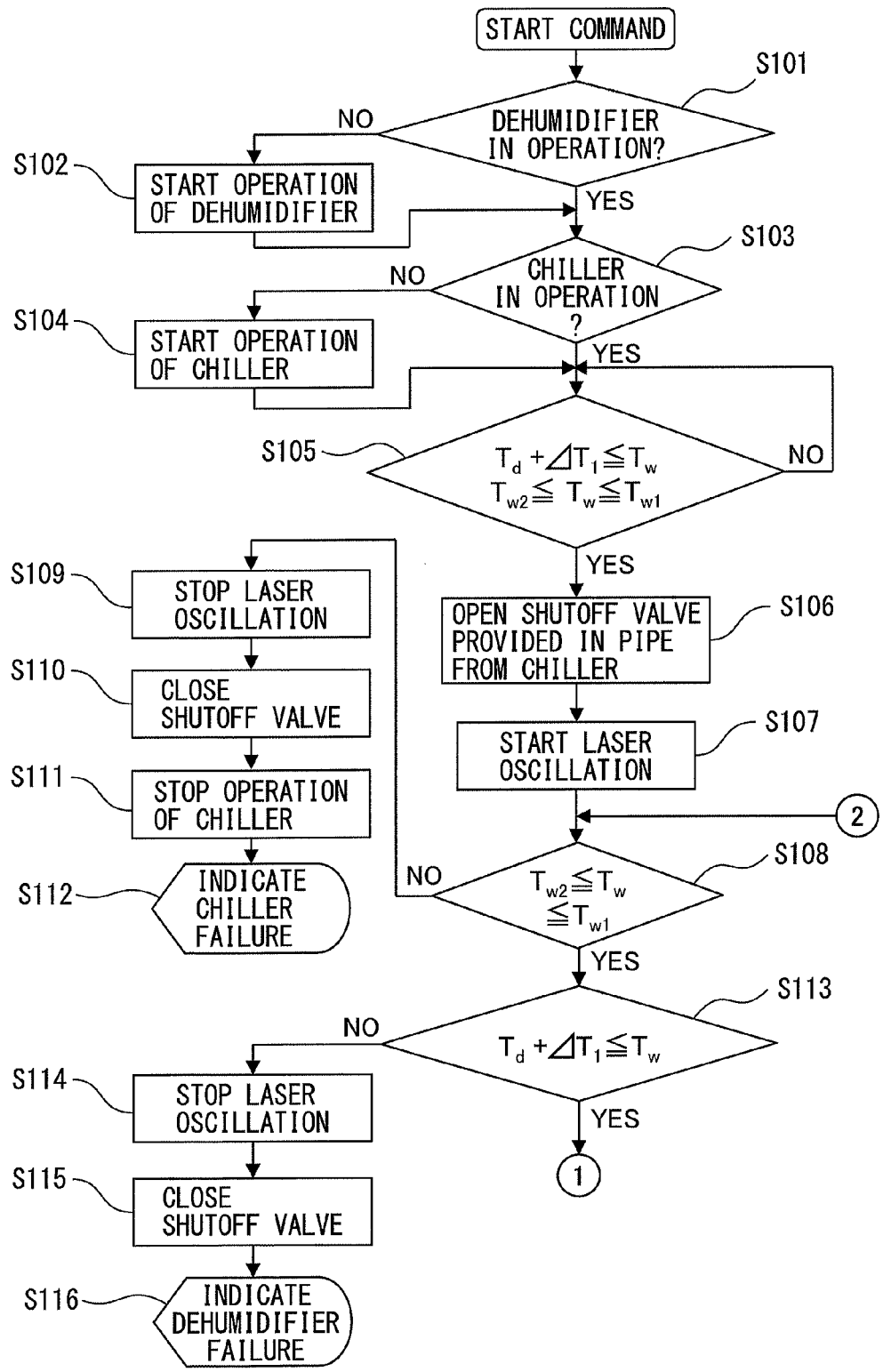
FIG. 3A is a control flowchart for the laser apparatus according to the first embodiment.
Figure 3B:
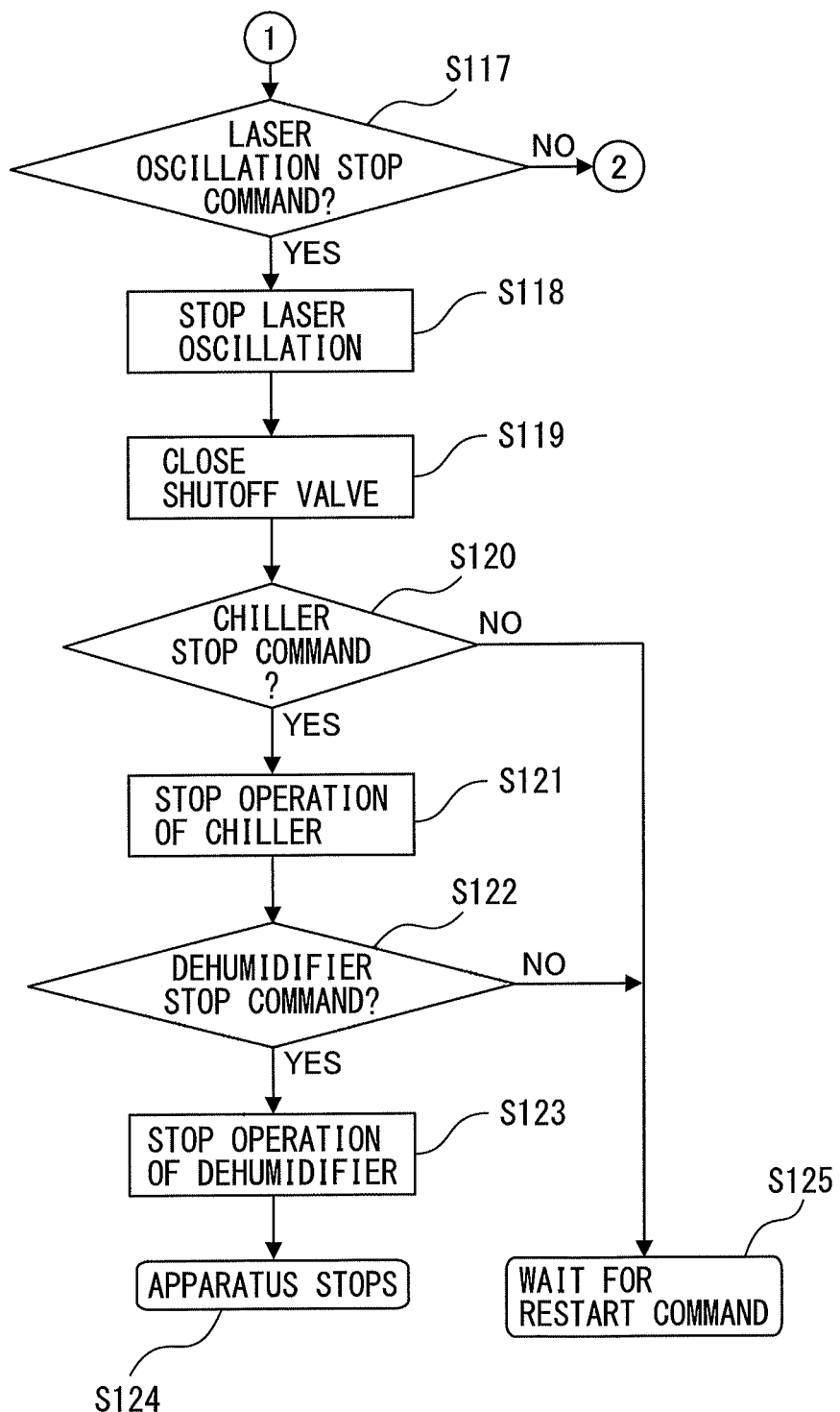
FIG. 3B is a control flowchart for the laser apparatus according to the first embodiment.

Laser apparatus 1 according to a first embodiment will be described with reference to FIGS. 1 to 3B. FIG. 1 is a schematic diagram showing the configuration of the laser apparatus 1. FIG. 2 is a control time chart, and FIGS. 3A and 3B are control flowcharts.

In the first embodiment, the laser apparatus 1 includes, as shown in FIG. 1, a laser oscillator 2, a power supply unit 3, a cabinet 5, a dehumidifier 6, a humidity detector 7, a first temperature detector 8, a second temperature detector 9, a computing unit 10, a decision unit 11, and a control unit 12. A cooling water supply apparatus 4 is provided outside the laser apparatus 1. The cooling water supply apparatus 4 supplies cooling water for cooling a heat-generating component contained in the laser apparatus 1.

The laser oscillator 2 is a laser oscillator having any known configuration. The laser oscillator 2 outputs laser light 19 through an optical system 18. The power supply unit 3 supplies a driving current to the laser oscillator 2.

The cabinet 5 is one that has hermeticity necessary to reduce the amount of air infiltrating from outside the laser apparatus 1 into the interior of the laser apparatus 1 to a level not higher than a predetermined value. The dehumidifier 6 dehumidifies the air inside the laser apparatus 1. The humidity detector 7 detects the humidity of the air inside the laser apparatus 1.

The first temperature detector 8 detects the temperature of the air inside the laser apparatus 1. The second temperature detector 9 detects the temperature of the cooling water supplied from outside the laser apparatus 1.

The computing unit 10 computes the dew point of the air inside the laser apparatus 1 from the detection results supplied from the humidity detector 7 and the first temperature detector 8.

The decision unit 11 makes a decision, based on the detection result from the second temperature detector 9 and the dew point computed by the computing unit 10, as to whether a flow start condition for starting to flow the cooling water into the interior of the laser apparatus 1 or an oscillation start condition for causing the laser oscillator 2 to start laser oscillation by supplying the driving current from the power supply unit 3 to the laser oscillator 2 has been satisfied or not.

Based on the result of the decision made by the decision unit 11, the control unit 12 controls the opening and closing of a shutoff valve provided in a pipe through which the cooling water supplied from the cooling water supply apparatus 4 flows, or controls the supply of the driving current from the power supply unit 3 to the laser oscillator 2.

In this patent specification, the "dehumidifier" includes any device having a dehumidifying function, including those such as a cooler commonly called by a name other than "dehumidifier". Open arrows shown alongside the dehumidifier 6 in FIG. 1 indicate the directions of the air flowing in and out the dehumidifier 6, respectively. However, the directions of the air flow are not limited to the directions illustrated here. Further, in FIG. 1, the cooling water pipe 16 is indicated by a thick dashed line, and the cooling water flow direction is indicated by an arrow.

As shown in the time chart of FIG. 2, in the first embodiment, the decision unit 11 is configured to compare the dew point computed by the computing unit 10 with the cooling water temperature detected by the second temperature detector 9 and, when it is decided that the relation (dew point)+(first predetermined temperature difference)≤(cooling water temperature) and the relation (allowable lower limit of cooling water temperature during laser oscillation) ≤(cooling water temperature)≤(allowable upper limit of cooling water temperature during laser oscillation) are both satisfied, the shutoff valve provided in the cooling water pipe 16 is opened to start to flow the cooling water into the interior of the laser apparatus 1 and, after that the driving current is supplied to the laser oscillator 2 to start laser oscillation.

The cooling water supply apparatus 4 is configured to continue to supply the cooling water during the laser oscillation, the cooling water being controlled within a first predetermined temperature range defined between the allowable lower limit of the cooling water temperature during the laser oscillation and the allowable upper limit of the cooling water temperature during the laser oscillation. On the other hand, the dehumidifier 6 is configured to continue to dehumidify the air during the laser oscillation so that the relation (dew point)+(first predetermined temperature difference)≤(cooling water temperature) is maintained.

The laser apparatus 1 is configured not to stop laser oscillation once the laser oscillation is started for the purpose of protecting the laser apparatus 1 against condensation or preventing condensation from forming inside it, as long as a phenomenon identified as being caused by failure of the cooling water supply apparatus 4 or the dehumidifier 6 is not detected.

In the laser apparatus 1 having the configuration shown in FIG. 1, opening the shutoff valve to start to flow the cooling water into the interior of the laser apparatus 1 means opening the closed shutoff valves 2 (14) and 3 (15) from the condition in which the shutoff valve 1 (13) is open and then closing the shutoff valve 1. On the other hand, closing the shutoff valve to stop flowing the cooling water into the interior of the laser apparatus means opening the shutoff valve 1 (13) and closing the shutoff valves 2 (14) and 3 (15).

While connections to the control unit 12 are not shown here, the shutoff valves 1 (13), 2 (14), and 3 (15) are valves, for example, electromagnetic valves, that can be opened and closed in response to commands from the control unit 12. Even when the shutoff valves 2 (14) and 3 (15) are not open, condensation may occur in the portion where the cooling water flows. Accordingly, it is desirable that a partition 17 or the like be provided inside the laser apparatus 1 to separate the portion where the cooling water flows from the main interior space where the laser oscillator 2, etc., are accommodated.

When the cooling water temperature is lower than the allowable lower limit of the cooling water temperature during the laser oscillation because, for example, the ambient temperature of the laser apparatus 1 is low, it may take a longer time for the cooling water temperature to reach the allowable lower limit of the cooling water temperature during the laser oscillation, depending on the specifications of the cooling water supply apparatus 4. In such cases, in order to shorten the waiting time to start the laser oscillation, a cooling water heating means 27 such as shown in FIG. 1 may be provided, and the cooling water may be heated by the cooling water heating means 27 under instruction from the control unit 12.

Conversely, to address a situation where the temperature outside the laser apparatus 1, i.e., the ambient temperature of the laser apparatus 1, is high, a radiator fan unit, not shown in FIG. 1, may be provided inside the laser apparatus 1 in order to suppress the temperature rise of the air inside the laser apparatus 1. The radiator fan unit produces a current of air inside the laser apparatus 1 by means of a fan and removes heat by passing the air over the fins formed on the surface of a branch pipe branching from the cooling water pipe 16 shown in FIG. 1.

Dew point in a closed space does not change with air temperature, unless the air is dehumidified or is humidified from the outside. As a result, once the relation (dew point)+(first predetermined temperature difference)≤(cooling water temperature) holds, the relation (dew point)+(first predetermined temperature difference)≤(cooling water temperature) can be maintained as long as the dehumidifier 6 has a dehumidifying capacity exceeding a maximum amount of moisture per unit time that can infiltrate from outside the laser apparatus 1 into the interior of the laser apparatus 1, the maximum amount being estimated from an allowable environmental condition of the laser apparatus 1 and the hermeticity provided by the cabinet 5 to reduce the amount of air infiltrating from outside the laser apparatus 1 into the interior of the laser apparatus 1 to a level not higher than a predetermined value.

In one embodiment, the dehumidifier 6 may be configured to continue to dehumidify the air during a period that the cooling water is being supplied from the cooling water supply apparatus 4 into the interior of the laser apparatus 1. In that case, condensation does not occur because the relation (dew point)+(first predetermined temperature difference)≤(cooling water temperature) is maintained during that period. Since no particular problem is presented by having too low of a dew point, there is no need to control the operation of the dehumidifier 6 by feeding back the dew point.

As a result, according to the first embodiment, since condensation does not occur inside the laser apparatus 1, there is no need to stop the laser oscillation or the supply of the cooling water in order to prevent condensation or provide protection against condensation. Continuously operating the dehumidifier 6 offers the advantage that not only can condensation be prevented in a reliable manner but, in the case of a dehumidifier using a compressor, the compressor can also be prevented from deteriorating due to on/off operations.

The dehumidifier 6 may be an electronic cooling-type dehumidifier using a Peltier element. In particular, in the first embodiment, since the dehumidifier 6 is operated continuously or nearly continuously, the probability of failure of the dehumidifier 6 can be reduced by constructing it using a Peltier element that has no moving parts and that is less prone to wear. The above-mentioned first predetermined temperature difference is a positive temperature difference, and can be set, for example, to about 5° C.

In the first embodiment, in accordance with the flowchart shown in FIGS. 3A and 3B, the computing unit 10 computes the dew point of the air inside the laser apparatus 1, and the control unit 12 performs various control operations based on the result of the decision made by the decision unit 11. In FIGS. 3A and 3B, "$T_w$" is the cooling water temperature, "$T_{w1}$" is the allowable upper limit of the cooling water temperature during the laser oscillation, that is, the upper limit temperature of the first predetermined temperature range, and "$T_{w2}$" is the allowable lower limit of the cooling water temperature during the laser oscillation, that is, the lower limit temperature of the first predetermined temperature range. On the other hand, "$T_d$" is the dew point of the air inside the laser apparatus 1, and "$\Delta T_1$" is the first predetermined temperature difference. In the flowchart, the cooling water supply apparatus 4 is referred to as the chiller.

(Steps S101 to S104)

When a start command is issued to the laser apparatus 1, first the dehumidifier 6 and the chiller 4 are started to operate. In order to shorten the wait time until the laser oscillation can be started, the operation of at least one of the chiller 4 and the dehumidifier 6 may be started automatically or manually in accordance with a predetermined time schedule prior to the time at which the laser apparatus 1 is scheduled to be used. In that case, if the dehumidifier 6 or the chiller 4 is already in operation when the start command is issued, the step of starting the operation of the dehumidifier 6 or the chiller 4 may be skipped.

(Steps S105 to S107)

When the temperature obtained by adding the first predetermined temperature difference $\Delta T_1$ to the dew point $T_d$ of the air inside the laser apparatus 1 becomes lower than the cooling water temperature $T_w$, and when the cooling water temperature $T_w$ enters the first predetermined temperature range, which is the temperature range defined between the allowable lower limit $T_{w2}$ of the cooling water temperature during the laser oscillation and the allowable upper limit $T_{w1}$ of the cooling water temperature during the laser oscillation, the shutoff valve installed in the pipe from the chiller 4 is opened to start the supply of the cooling water, and then the laser oscillation is started.

(Steps S108 to S116)

After it is determined that the temperature obtained by adding the first predetermined temperature difference $\Delta T_1$ to the dew point $T_d$ of the air inside the laser apparatus 1 is lower than the cooling water temperature $T_w$, and that the cooling water temperature $T_w$ lies within the first predetermined temperature range, if the cooling water temperature $T_w$ deviates outside the first predetermined temperature range, it is determined that the chiller 4 has failed. On the other hand, if the temperature obtained by adding the first predetermined temperature difference $\Delta T_1$ to the dew point $T_d$ of the air inside the laser apparatus 1 becomes higher than the cooling water temperature $T_w$, it is determined that the dehumidifier 6 has failed. If it is determined that the chiller 4 or the dehumidifier 6 has failed, a laser oscillation is stopped and the shutoff valve is closed to prevent the cooling water from flowing into the apparatus 1 except the area therein enclosed by the partition 17, and an indication indicating the failure of the chiller 4 or the dehumidifier 6 is displayed on the display unit 21.

However, if the chiller 4 has a sufficient cooling water temperature regulating capability with respect to the amount of heat generated inside the laser apparatus 1 and the installation allowable temperature range of the laser apparatus 1, condensation can be prevented from forming, except when the chiller 4 or the dehumidifier 6 has failed, as described above. More specifically, if the first predetermined temperature range is properly set with respect to the cooling water temperature regulation accuracy of the chiller 4, and if the dehumidifier 6 has a sufficient dehumidifying capacity with respect to the amount of moisture per unit time expected to infiltrate into the laser apparatus 1 and estimated from the hermeticity of the cabinet 5 of the laser apparatus 1, then there is no possibility of the cooling water temperature $T_w$ deviating outside the first predetermined temperature range, once the cooling water temperature $T_w$ is brought into the first predetermined temperature range and the temperature obtained by adding the first predetermined temperature difference $\Delta T_1$ to the dew point $T_d$ of the air inside the laser apparatus 1 has become lower than the cooling water temperature $T_w$. Furthermore, since there is no possibility that the temperature obtained by adding the first predetermined temperature difference $\Delta T_1$ to the dew point $T_d$ of the air inside the laser apparatus 1 will become higher than the cooling water temperature $T_w$, the laser oscillation is continued as long as a laser oscillation stop command is not issued. This reliably prevents condensation from forming on any component cooled by the cooling water.

(Steps S117 to S125)

To completely stop the operation of the laser apparatus 1, the stopping of the laser oscillation, the closing of the shutoff valve, the stopping of the cooling water supply, the stopping of the operation of the chiller 4, and the stopping of the operation of the dehumidifier 6 are performed in sequence. In order to shorten the laser oscillation waiting time when starting the laser apparatus 1 next time, or to prevent condensation from forming on the components of the laser apparatus 1 during a period when the laser oscillation is not performed, the operation of at least one of the chiller 4 and the dehumidifier 6 may be continued, and switching may be made to a standby state waiting for a restart command. When continuing the operation only of the chiller 4, the shutoff valve must be closed to prevent the cooling water from flowing into the laser apparatus 1.

In the first embodiment, the computing unit 10 that computes the dew point of the air inside the laser apparatus 1 from the detection results supplied from the humidity detector 7 and the first temperature detector 8 may be replaced by a recording unit which records a data table that can derive the dew point from the humidity and temperature. In that case, by referring to the data table, the dew point of the air inside the laser apparatus 1 can be obtained from the detection results supplied from the humidity detector 7 and the first temperature detector 8.

Figure 5A:
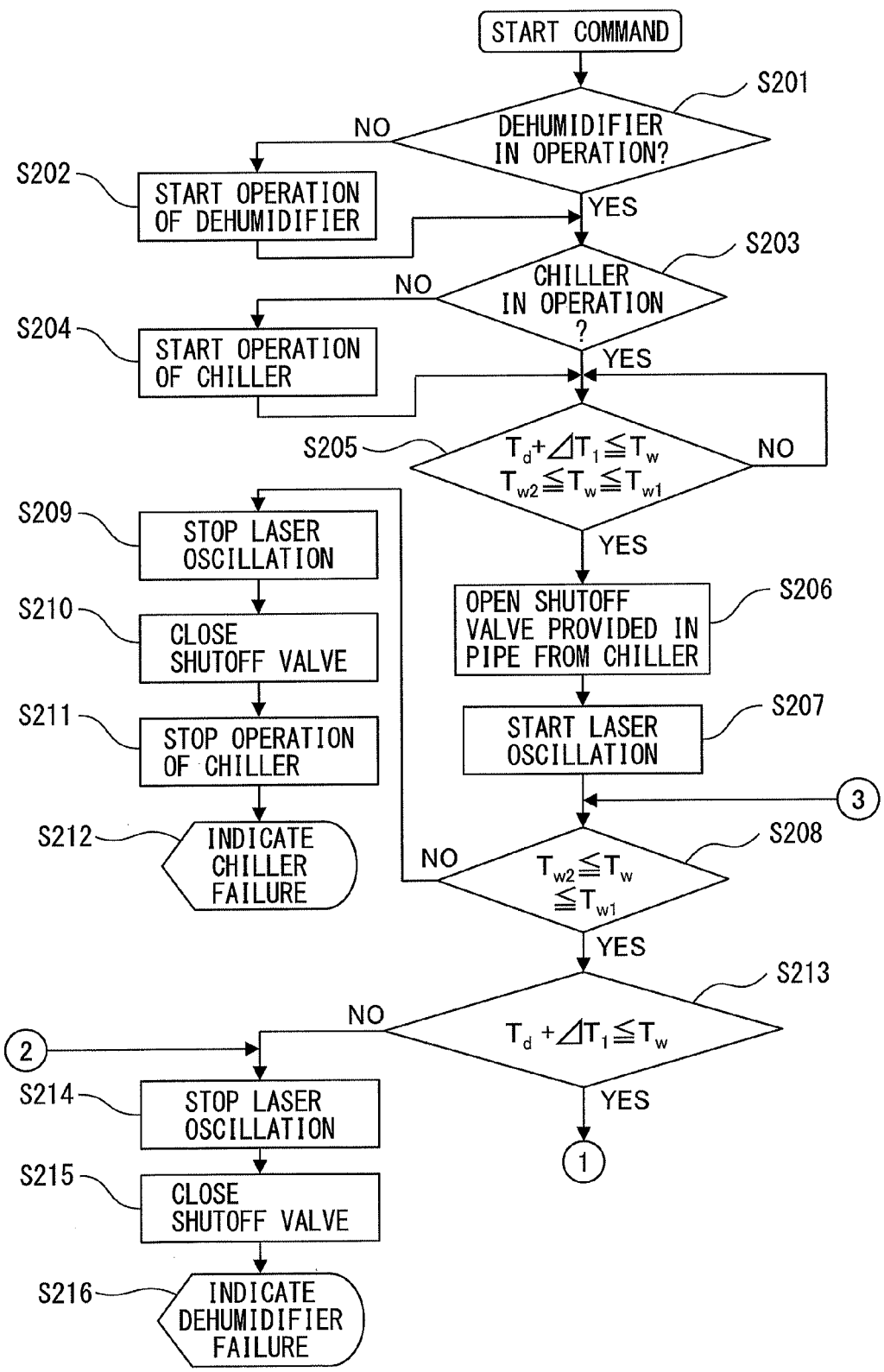
FIG. 5A is a control flowchart for the laser apparatus according to the second embodiment.
Figure 5B:
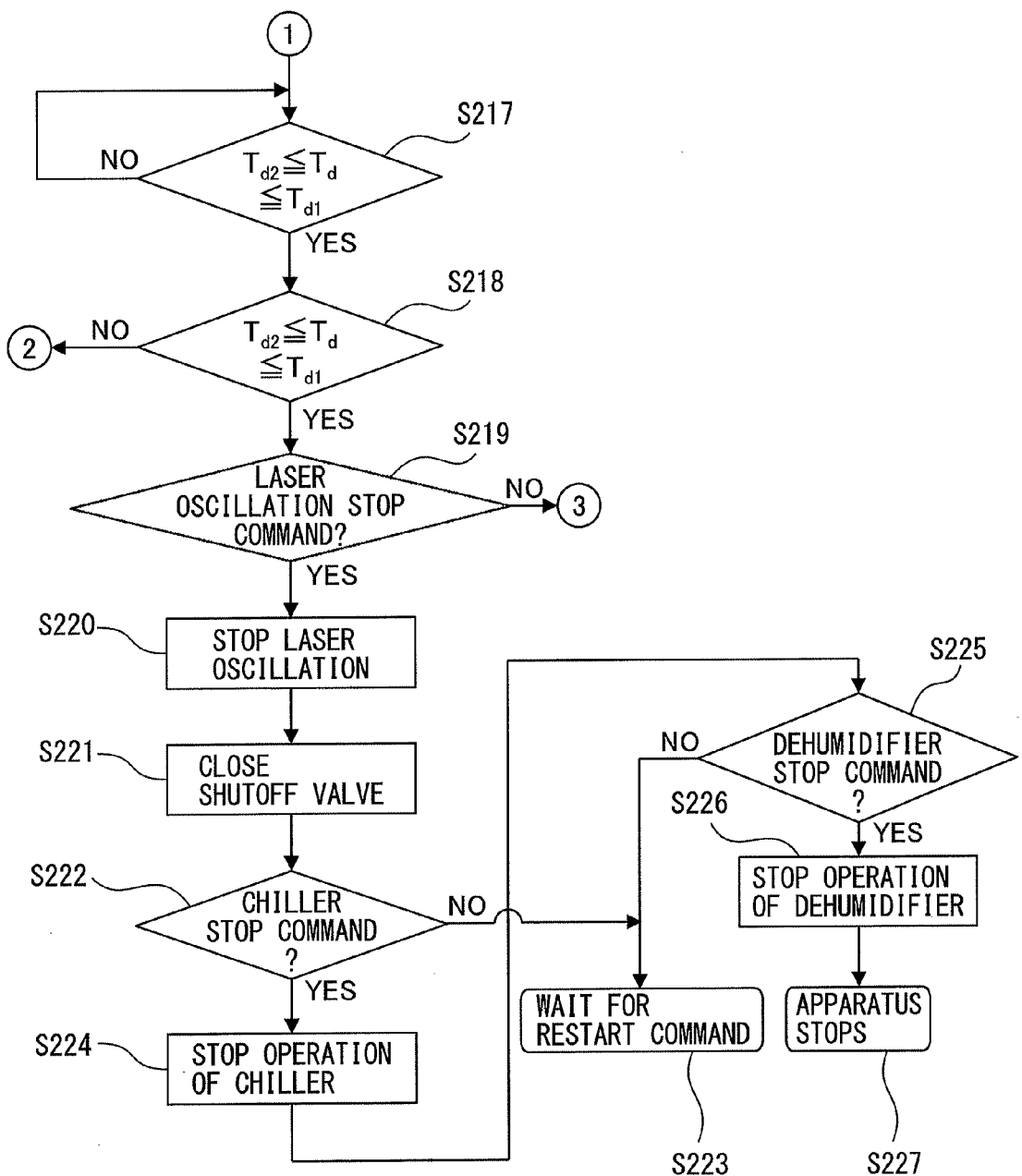
FIG. 5B is a control flowchart for the laser apparatus according to the second embodiment.

Laser apparatus 1 according to a second embodiment will be described below with reference to FIGS. 4, 5A, and 5B. FIG. 4 is a control time chart, and FIGS. 5A and 5B are control flowcharts. As shown in FIGS. 4, 5A, and 5B, in this embodiment, the dehumidifier 6 is controlled so that the dew point of the air inside the laser apparatus 1 lies within a second predetermined temperature range which is lower than the first predetermined temperature range, and so that the dew point, once brought into the second predetermined temperature range, will not deviate outside the second predetermined temperature range.

By not dehumidifying the air more than necessary, the power consumption of the dehumidifier 6 can be reduced, and if control is performed by inverter control or a like method that reduces the load on the dehumidifier 6, there is offered the advantage of reducing the driving time of the dehumidifier 6 and preserving the service life of the dehumidifier 6.

In FIG. 4, the value calculated by subtracting the upper limit temperature of the second predetermined temperature range from the lower limit temperature of the first predetermined temperature range may be set approximately equal to the first predetermined temperature difference or set larger than the first predetermined temperature difference. By thus setting the value, condensation can be reliably prevented even when the cooling water temperature has dropped to a point near the lower limit temperature of the first predetermined temperature range and the dew point of the air inside the laser apparatus 1 has risen to a point near the upper limit temperature of the second predetermined temperature range.

In FIGS. 5A and 5B, "$T_w$" is the cooling water temperature, "$T_{w1}$" is the allowable upper limit of the cooling water temperature during the laser oscillation, that is, the upper limit temperature of the first predetermined temperature range, and "$T_{w2}$" is the allowable lower limit of the cooling water temperature during the laser oscillation, that is, the lower limit temperature of the first predetermined temperature range. On the other hand, "$T_d$" is the dew point of the air inside the laser apparatus 1, "$T_{d1}$" is the upper limit temperature of the second predetermined temperature range, "$T_{d2}$" is the lower limit temperature of the second predetermined temperature range, and "$\Delta T_1$" is the first predetermined temperature difference.

The flowcharts of FIGS. 5A and 5B differ from the corresponding flowcharts of the first embodiment shown in FIGS. 3A and 3B by the inclusion of the flow in which if the dew point $T_d$ of the air inside the laser apparatus 1 deviates outside the second predetermined temperature range after once entering the second predetermined temperature range, it is determined that the dehumidifier 6 has failed (steps S217 to S218), and then, the laser oscillation is stopped, and an indication indicating the failure of the dehumidifier 6 is displayed on the display unit 21.

Figure 6:
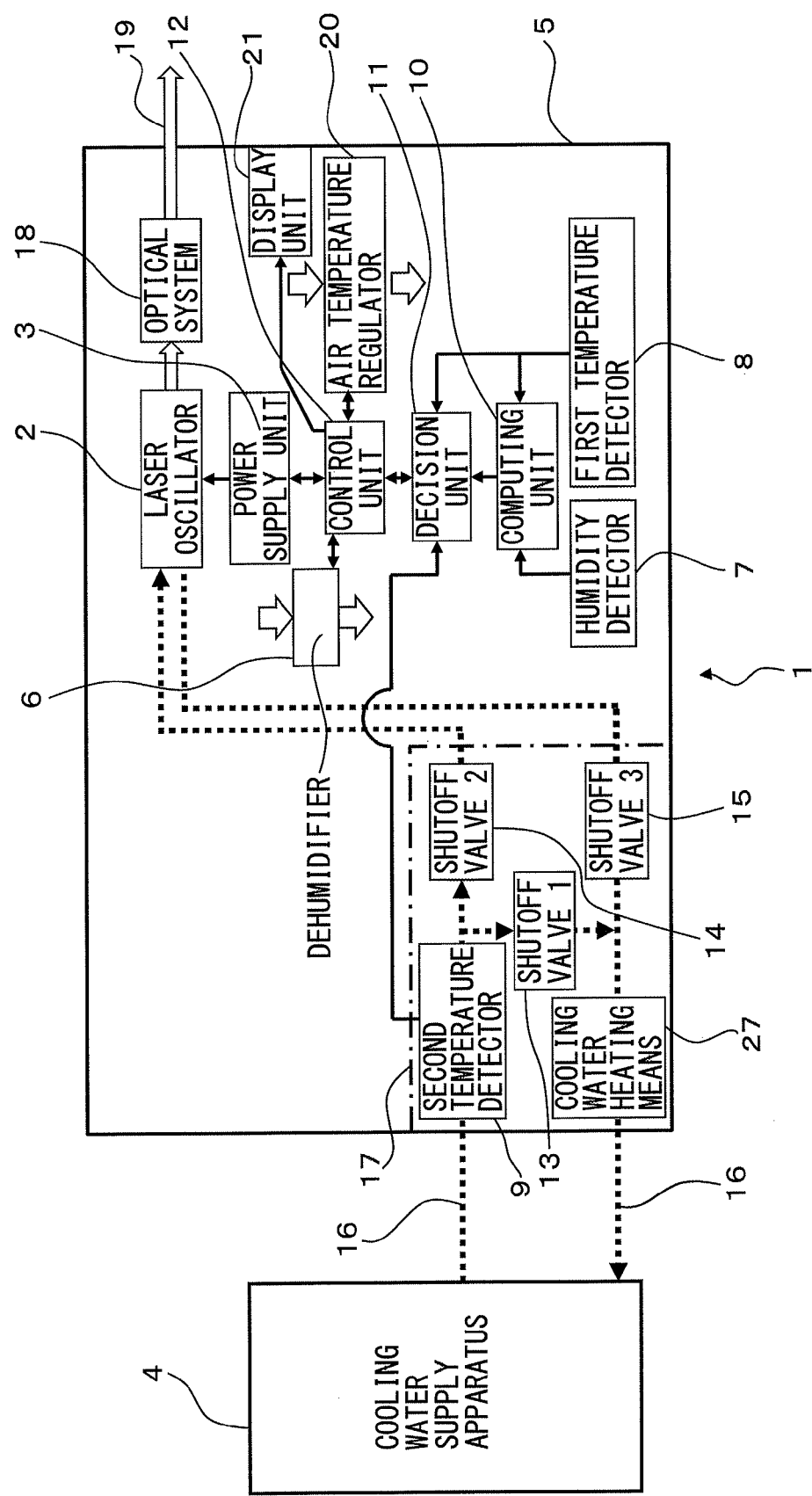
FIG. 6 is a schematic diagram showing the configuration of a laser apparatus according to a third embodiment.
Figure 8A:
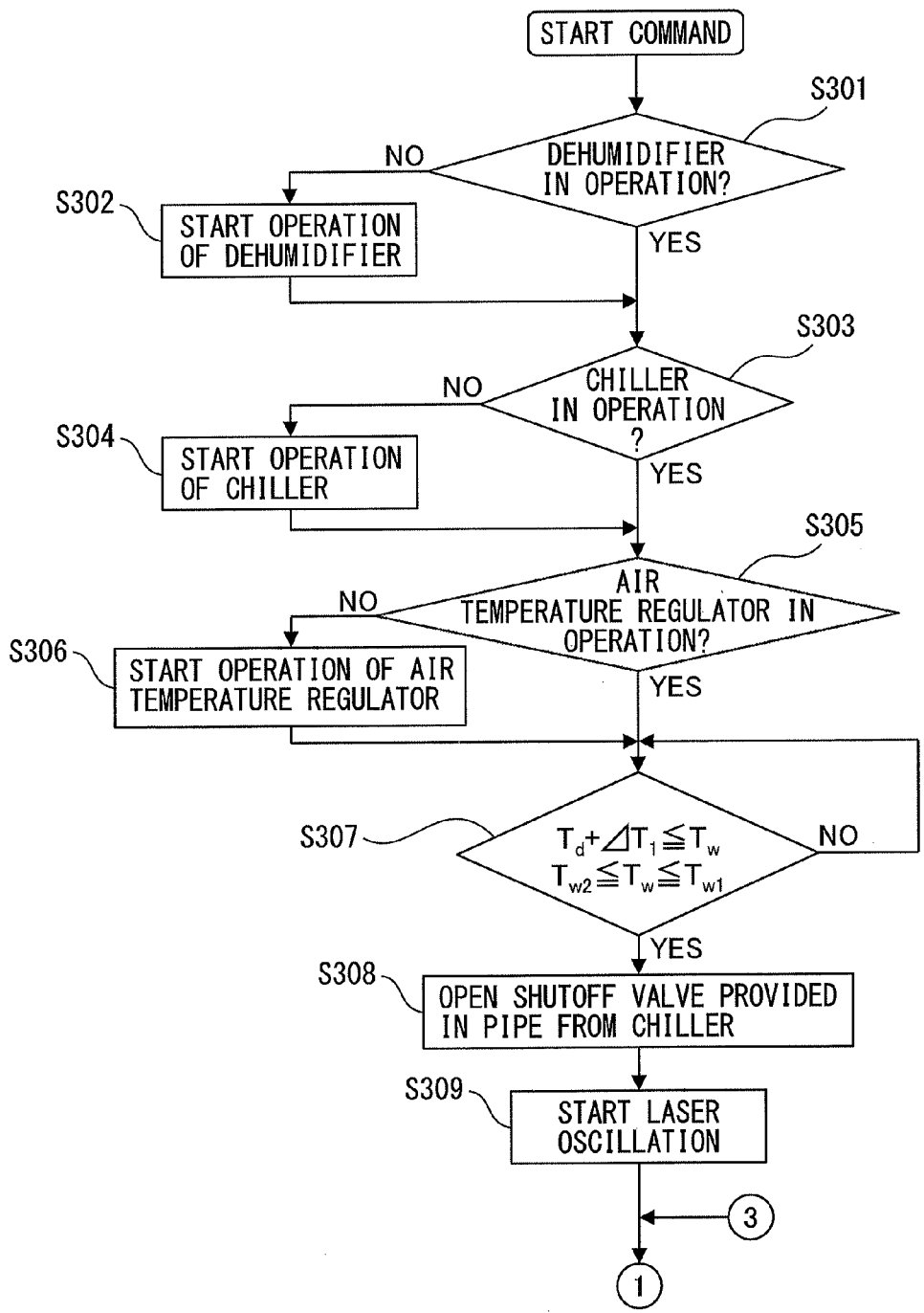
FIG. 8A is a control flowchart for the laser apparatus according to the third embodiment.
Figure 8B:
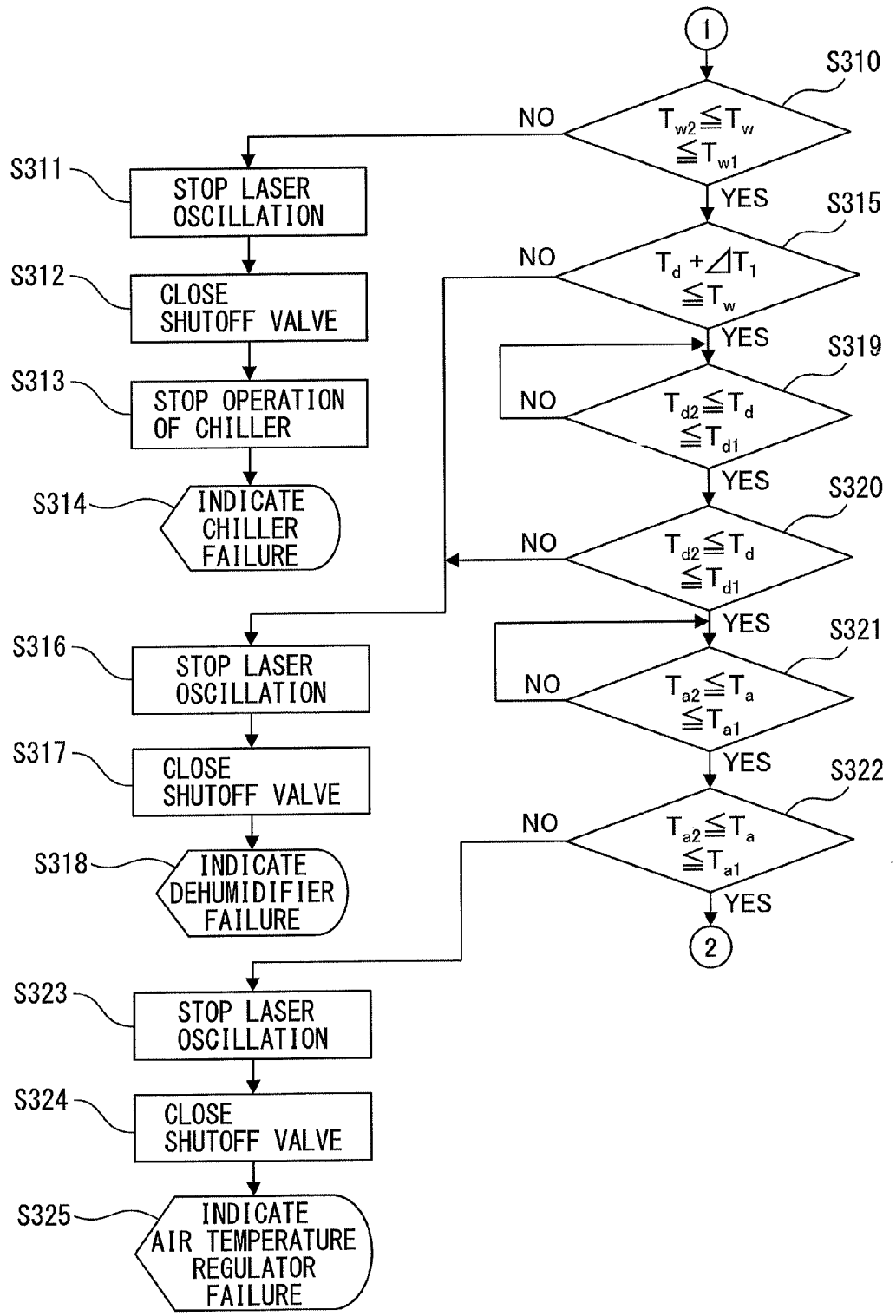
FIG. 8B is a control flowchart for the laser apparatus according to the third embodiment.
Figure 8C:
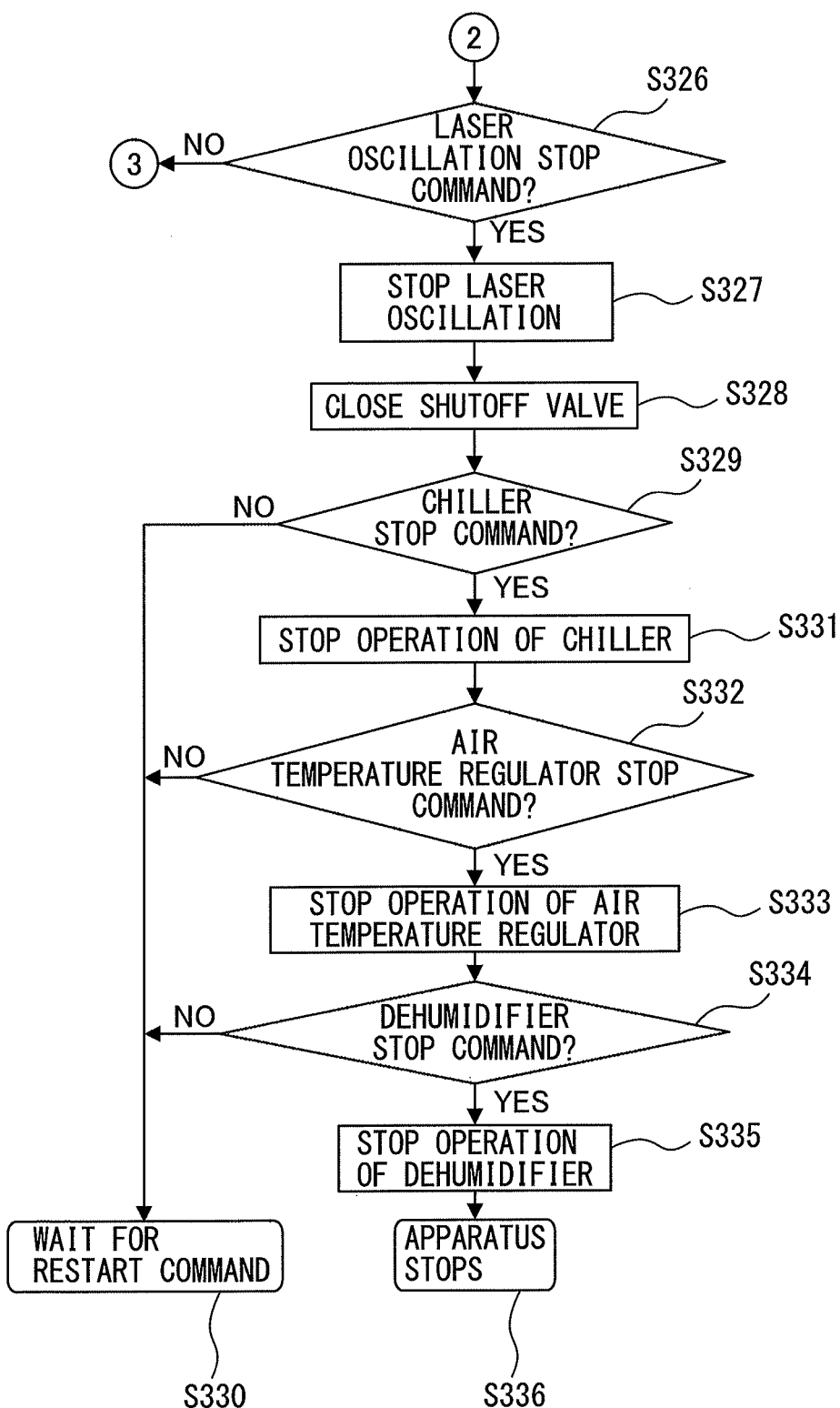
FIG. 8C is a control flowchart for the laser apparatus according to the third embodiment.

Laser apparatus 1 according to a third embodiment will be described below with reference to FIGS. 6 to 8C. FIG. 6 is a schematic diagram showing the configuration of the laser apparatus 1, FIG. 7 is a control time chart, and FIGS. 8A to 8C are control flowcharts.

As shown in FIG. 6, the laser apparatus 1 according to the third embodiment further includes an air temperature regulator 20 for regulating the temperature of the air inside the laser apparatus 1. Then, as shown in FIG. 7, in response to a command from the control unit 12, the temperature of the air inside the laser apparatus 1 is controlled by the air temperature regulator 20 so as to lie within a third predetermined temperature range. Then, once the temperature of the air inside the laser apparatus 1 is brought into the third predetermined temperature range, the temperature of the air inside the laser apparatus 1 is controlled so as not to deviate outside the third predetermined temperature range.

In one embodiment, the lower limit temperature of the third predetermined temperature range is set approximately equal to or higher than the lower limit temperature of the first predetermined temperature range. In the embodiment shown in FIG. 7, the lower limit temperature of the third predetermined temperature range is set higher than the lower limit temperature of the first predetermined temperature range. In this case, by controlling the dew point of the air inside the laser apparatus 1 and the temperature of the air inside the laser apparatus 1 independently of each other, the humidity of the air inside the laser apparatus 1 can be reliably prevented from increasing excessively.

Generally, a dehumidifier having a high dehumidifying capacity often has an attendant effect of cooling air, but according to the present embodiment, the temperature of the air inside the laser apparatus 1 can be prevented from dropping excessively, increasing the humidity inside the laser apparatus 1 or causing condensation on the outside walls of the laser apparatus 1. Furthermore, when the ambient temperature changes, the temperature of the air inside the laser apparatus 1 can be prevented from changing significantly, while preserving the dehumidifying function, and thus a stable internal environment can be achieved for the laser apparatus 1.

In this patent specification, the "air temperature regulator" includes any device having the function of heating, or removing heat from, the inlet air and discharging the air outside, even if the device is commonly called by a name other than "air temperature regulator".

In FIG. 6, open arrows shown alongside the air temperature regulator 20 indicate the directions of the air flowing into the air temperature regulator 20 and out of the air temperature regulator 20, respectively, and open arrows shown alongside the dehumidifier 6 indicate the directions of the air flowing into the dehumidifier 6 and out of the dehumidifier 6, respectively. But the directions of the air flow are not intended to be limited to the directions shown in FIG. 6.

In FIGS. 8A to 8C, "$T_w$" is the cooling water temperature, "$T_{w1}$" is the allowable upper limit of the cooling water temperature during the laser oscillation, that is, the upper limit temperature of the first predetermined temperature range, and "$T_{w2}$" is the allowable lower limit of the cooling water temperature during the laser oscillation, that is, the lower limit temperature of the first predetermined temperature range. On the other hand, "$T_d$" is the dew point of the air inside the laser apparatus 1, "$T_{d1}$" is the upper limit temperature of the second predetermined temperature range, and "$T_{d2}$" is the lower limit temperature of the second predetermined temperature range. Further, "$T_a$" is the temperature of the air inside the laser apparatus 1, "$T_{a1}$" is the upper limit temperature of the third predetermined temperature range, "$T_{a2}$" is the lower limit temperature of the third predetermined temperature range, and "$\Delta T_1$" is the first predetermined temperature difference.

The flowcharts of the third embodiment shown in FIGS. 8A to 8C differ from the corresponding flowcharts of the second embodiment shown in FIGS. 5A and 5B by the inclusion of the flow in which it is determined whether the air temperature regulator is in operation or not and, if it is not in operation, its operation is started (steps S305 and S306) and the flow in which if the temperature of the air inside the laser apparatus 1 deviates outside the third predetermined temperature range after once entering the third predetermined temperature range, it is determined that the air temperature regulator has failed, and then, the laser oscillation is stopped, and an indication indicating the failure of the air temperature regulator 20 is displayed on the display unit 21 (steps S321 to S325).

However, if the air temperature $T_a$ inside the laser apparatus 1 has deviated outside the third predetermined temperature range, this does not directly lead to a serious situation as long as the cooling water temperature $T_w$ and the dew point $T_d$ of the air inside the laser apparatus 1 are controlled within the respective predetermined temperature ranges; therefore, only a warning may be displayed on the display unit 21, with provisions made not to stop the laser oscillation immediately.

Likewise, when the cooling water temperature $T_w$ has deviated outside the first predetermined temperature range, or when the dew point $T_d$ of the air inside the laser apparatus 1 has deviated outside the second predetermined temperature range, if the amount of deviation is smaller than a predetermined range, the laser oscillation may not be stopped immediately, and only a warning message may be displayed, with provisions made not to stop the cooling water supply or the laser oscillation.

Referring to FIGS. 8A to 8C, the flow for stopping the laser oscillation (steps S327 to S336) is also modified. To completely stop the operation of the laser apparatus 1, the stopping of the laser oscillation, the closing of the shutoff valve, the stopping of the cooling water supply, the stopping of the operation of the chiller 4, the stopping of the operation of the air temperature regulator 20, and the stopping of the operation of the dehumidifier 6 are performed in sequence.

In order to shorten the laser oscillation waiting time when starting the laser apparatus 1, or to prevent condensation from forming on the components of the laser apparatus 1 during the period when the laser oscillation is not performed, the operation of the chiller 4, air temperature regulator 20, and dehumidifier 6 may be continued, or the operation of the air temperature regulator 20 and dehumidifier 6 may be continued, or alternatively the operation of only the dehumidifier 6 may be continued or, by closing the shutoff valve, the operation of only the chiller 4 may be continued, and switching may be made to a standby state waiting for a restart command.

Figure 9:
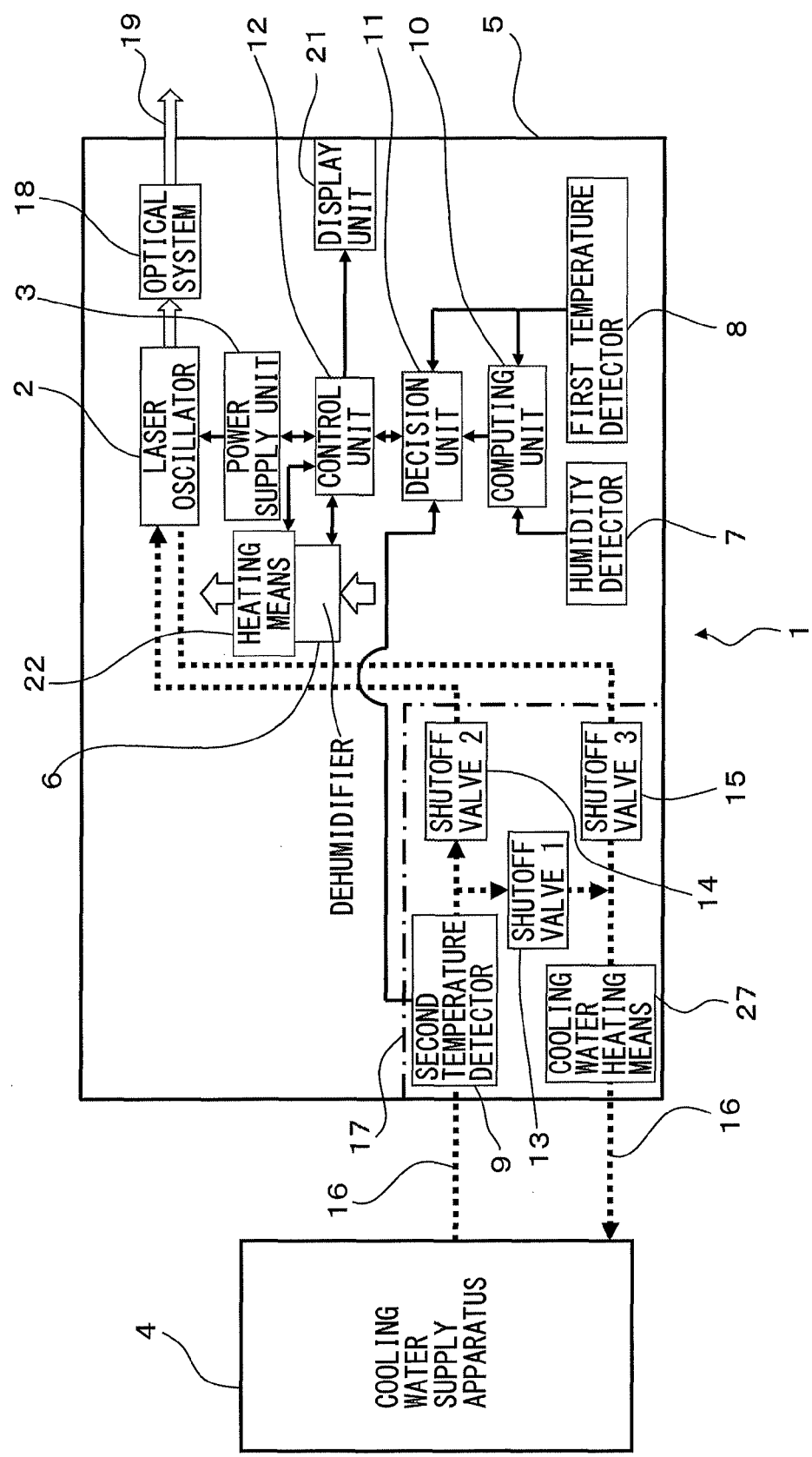
FIG. 9 is a schematic diagram showing the configuration of a laser apparatus according to a fourth embodiment.
Figure 10:
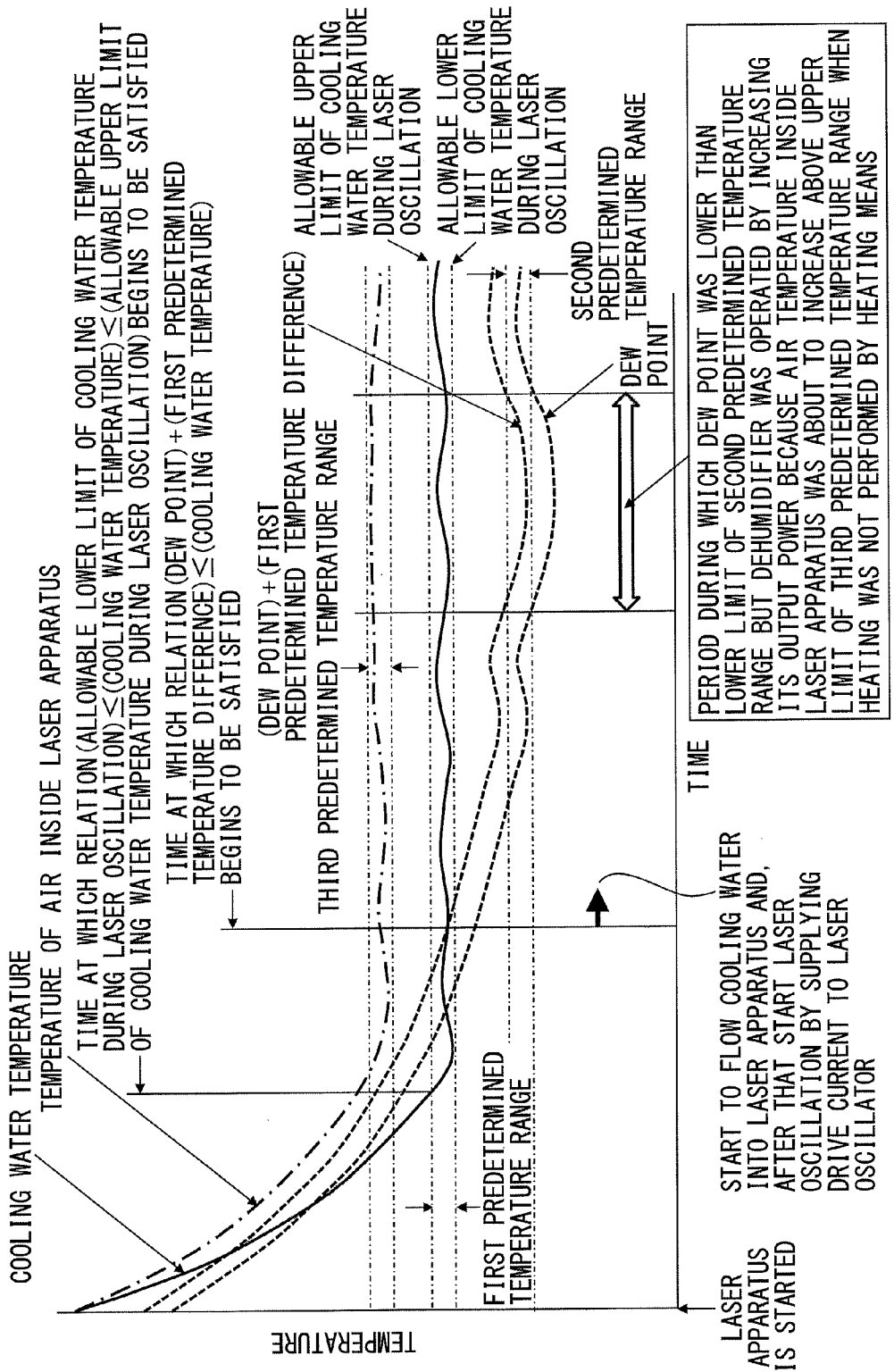
FIG. 10 is a control time chart for the laser apparatus according to the fourth embodiment.

Laser apparatus 1 according to a fourth embodiment will be described with reference to FIGS. 9 and 10. FIG. 9 is a schematic diagram showing the configuration of the laser apparatus 1, and FIG. 10 is a control time chart.

In the fourth embodiment, the dehumidifier 6 is of a type that cools the air flowing into the dehumidifier 6 to a temperature equal to or below the dew point and dehumidifies the air by causing condensation on a condensing unit contained in the dehumidifier 6. As shown in FIG. 9, the laser apparatus 1 further includes a heating means 22 for heating the air flowing out of the dehumidifier 6. In FIG. 9, open arrows schematically represent the flow of the air flowing into the dehumidifier 6 and the flow of the air flowing out of the dehumidifier 6 through the heating means 22, respectively. It is desirable that the air should flow first through the dehumidifier 6 and then through the heating means 22, but the direction of the flow need not necessarily be upward.

If the dehumidifier 6 is of the type having a relatively large effect of cooling the inlet air during dehumidification, substantially minimum necessary heating should be applied by controlling the heating means 22 so that the temperature of the air inside the laser apparatus 1 does not drop below the lower limit temperature of the third predetermined temperature range. By so doing, control can be performed in the same manner as that shown in the time chart of the third embodiment shown in FIG. 7. That is, the temperature of the air inside the laser apparatus 1 can be controlled within the third predetermined temperature range, while controlling the dew point of the air inside the laser apparatus 1 within the second predetermined temperature range.

On the other hand, if the dehumidifier 6 is of the type having a high dehumidifying efficiency and having a relatively small effect of cooling the inlet air, there can occur a situation where the temperature of the air inside the laser apparatus 1 increases or tries to increase above the upper limit temperature of the third predetermined temperature range, even when the dew point of the air inside the laser apparatus 1 is controlled within the second predetermined temperature range by the dehumidifier 6 and when heating is not performed by the heating means 22.

Such a situation can occur, for example, when the amount of heat generated inside the laser apparatus 1 increases or when the temperature outside the laser apparatus 1 rises. In such a case, if it is desired to perform control close to that of the third embodiment, one possible option will be to continue to control the dew point of the air inside the laser apparatus 1 within the second predetermined temperature range, while allowing the condition in which the temperature of the air inside the laser apparatus 1 is higher than the upper limit temperature of the third predetermined temperature range.

However, during the period of such a situation, even if the dew point of the air inside the laser apparatus 1 is lower than the lower limit temperature of the second predetermined temperature range, the dehumidifier 6 may be operated by increasing its output power, while controlling the temperature of the air inside the laser apparatus 1 within the third predetermined temperature range, as in the period indicated by an open arrow in the time chart of FIG. 10.

In the fourth embodiment, substantially the same function as that provided in the third embodiment can be achieved without requiring the provision of an air temperature regulator as in the third embodiment. Accordingly, the size and cost of the laser apparatus 1 can be reduced while reliably preventing the humidity of the air inside the laser apparatus 1 from increasing and condensation from forming on the low-temperature components cooled by the cooling water.

In the fourth embodiment, the dehumidifier 6 and the heating means 22 need not necessarily be constructed as separate components but may be combined in an integral fashion as an air conditioner that can control the air temperature and humidity independently of each other.

Figure 11:
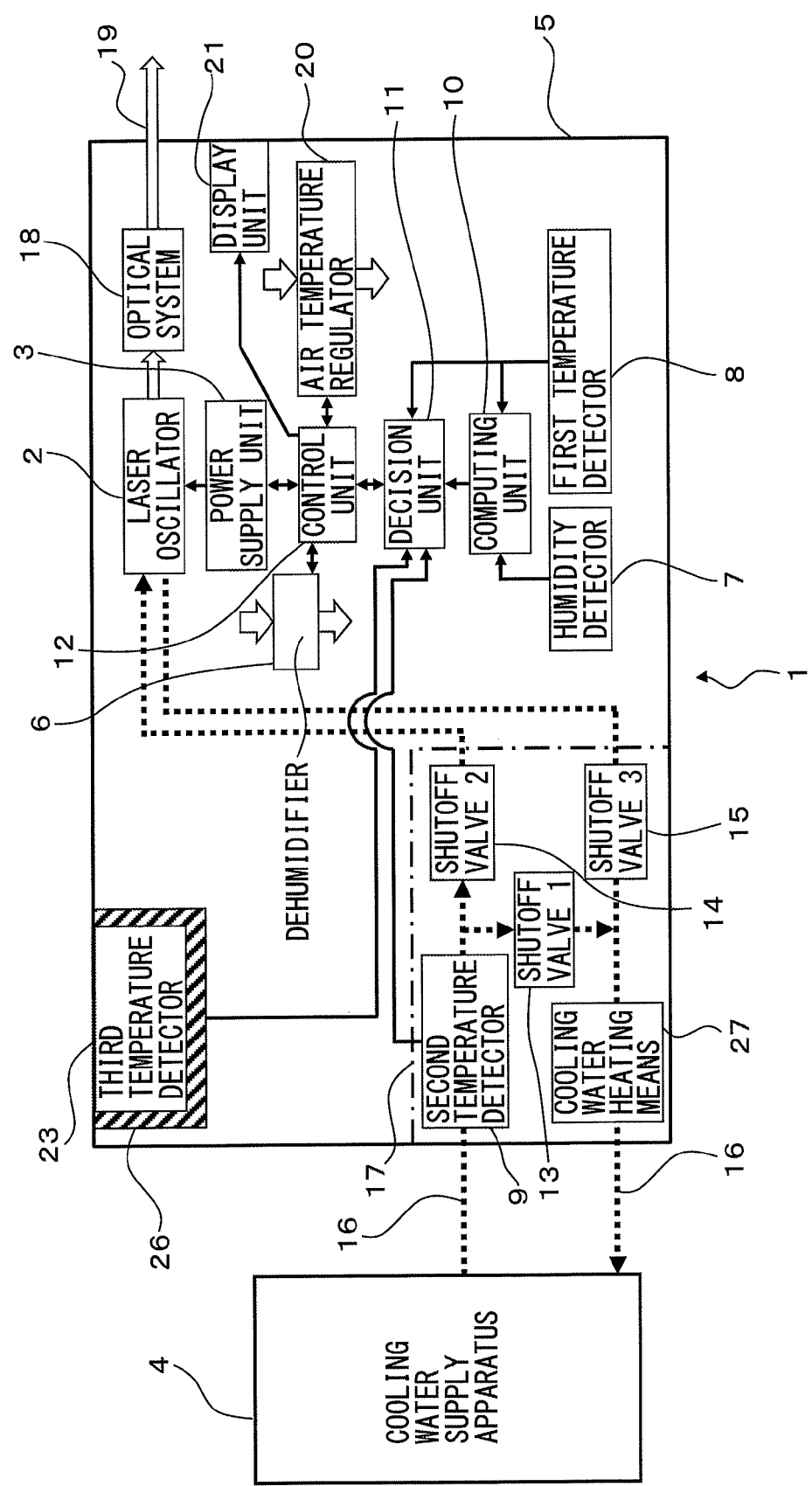
FIG. 11 is a schematic diagram showing the configuration of a laser apparatus according to a fifth embodiment.
Figure 12:
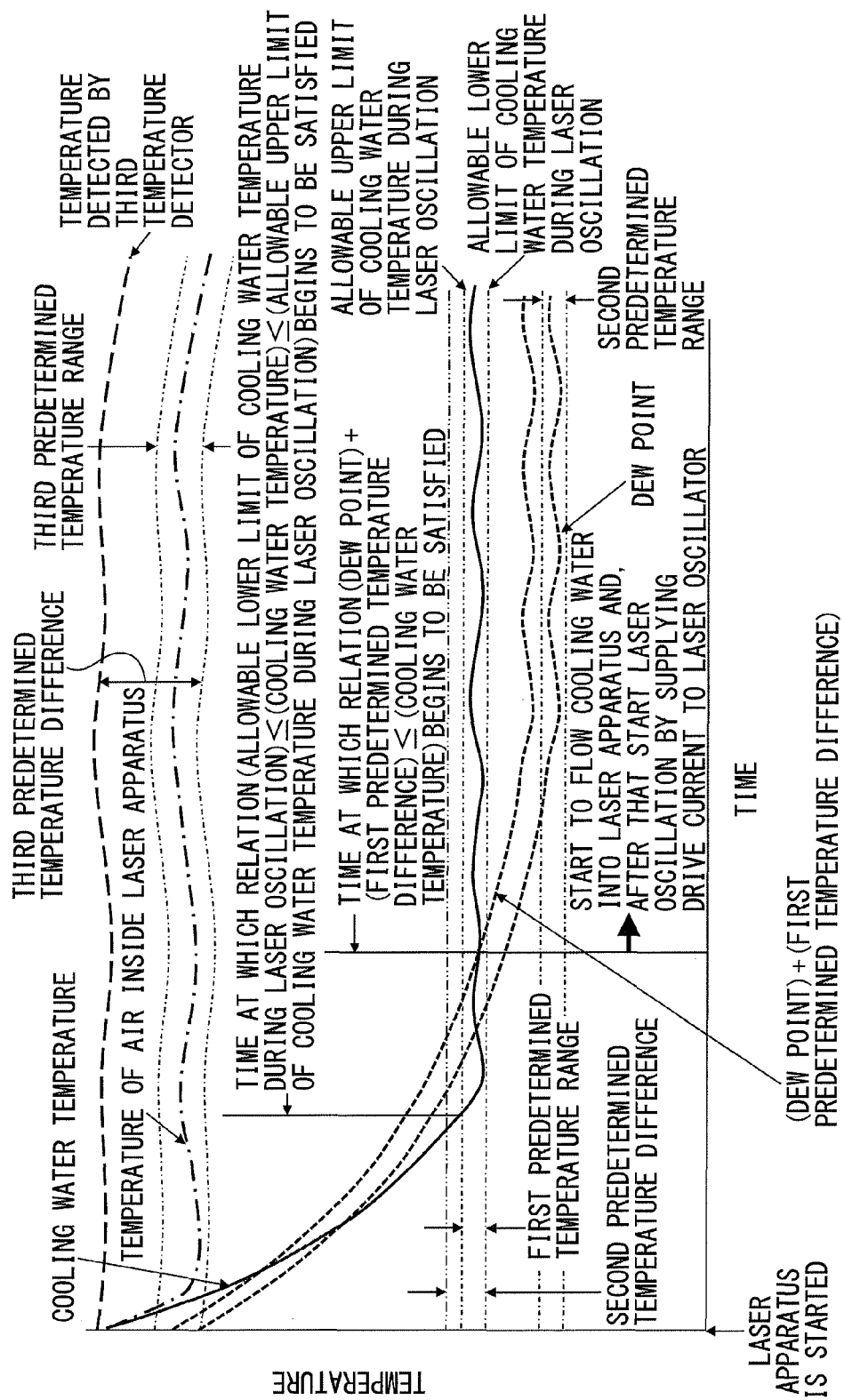
FIG. 12 is a control time chart for the laser apparatus according to the fifth embodiment.
Figure 13:
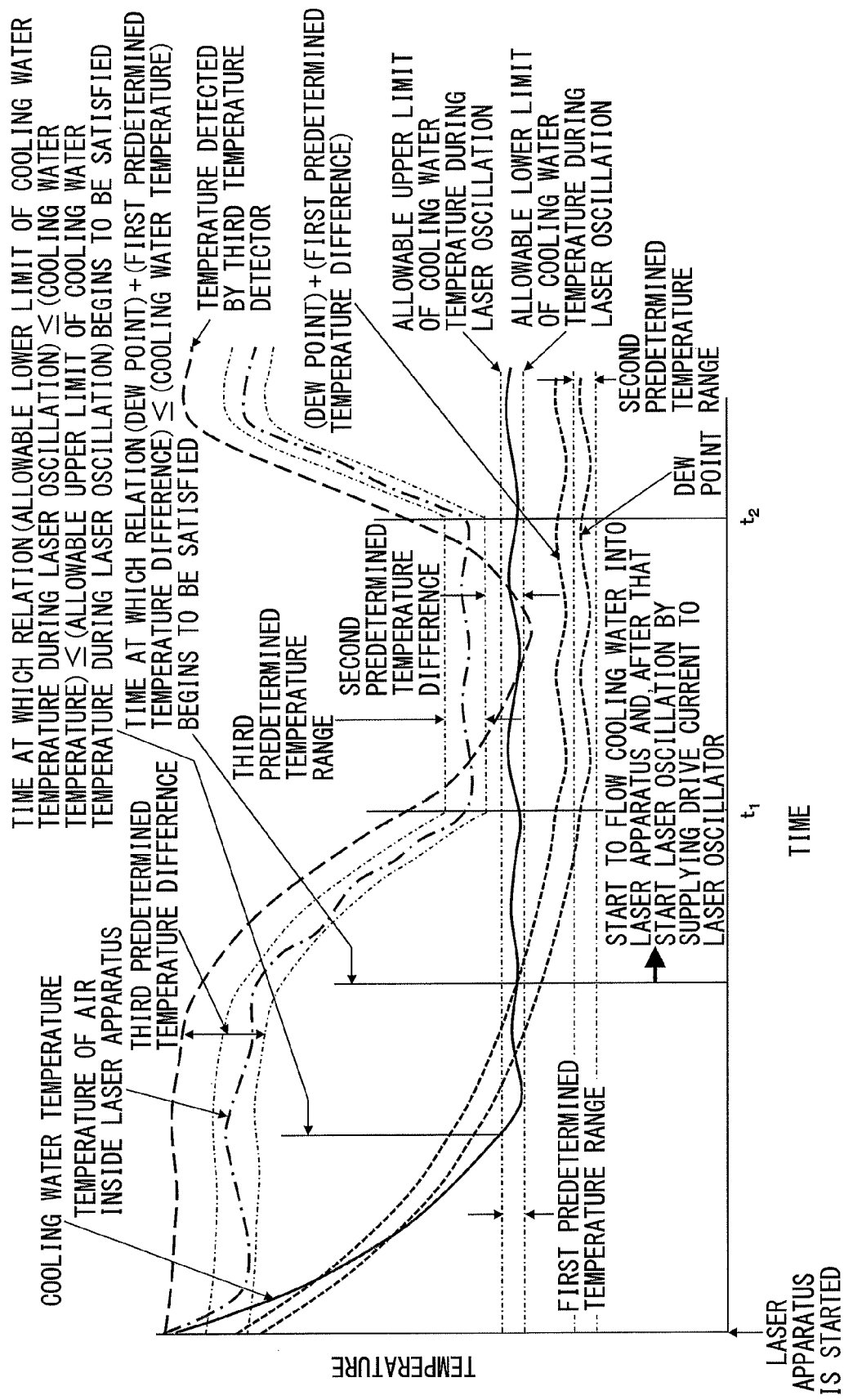
FIG. 13 is a control time chart for the laser apparatus according to the fifth embodiment.
Figure 14:
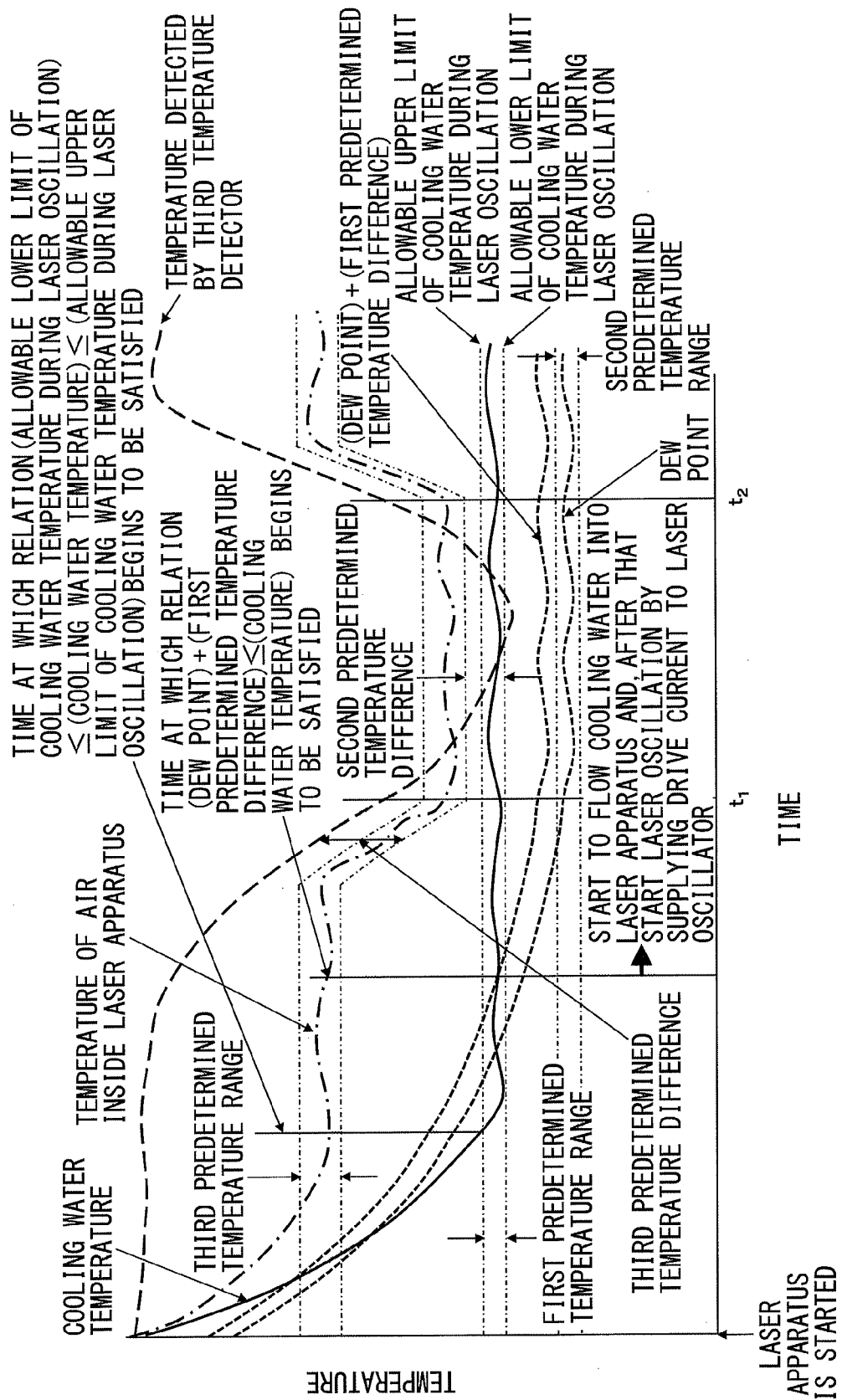
FIG. 14 is a control time chart for the laser apparatus according to the fifth embodiment.
Figure 15A:
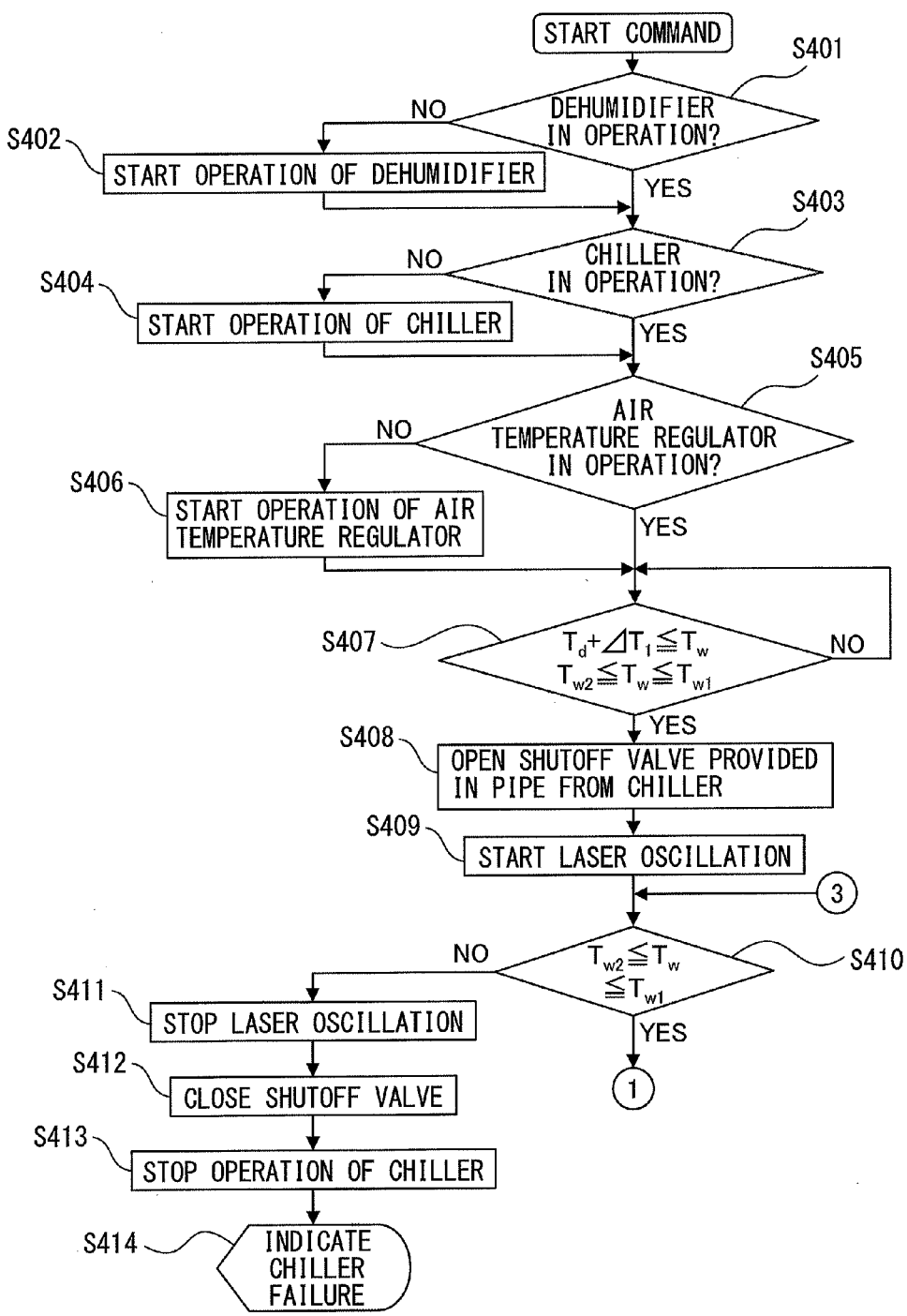
FIG. 15A is a control flowchart for the laser apparatus according to the fifth embodiment.
Figure 15B:
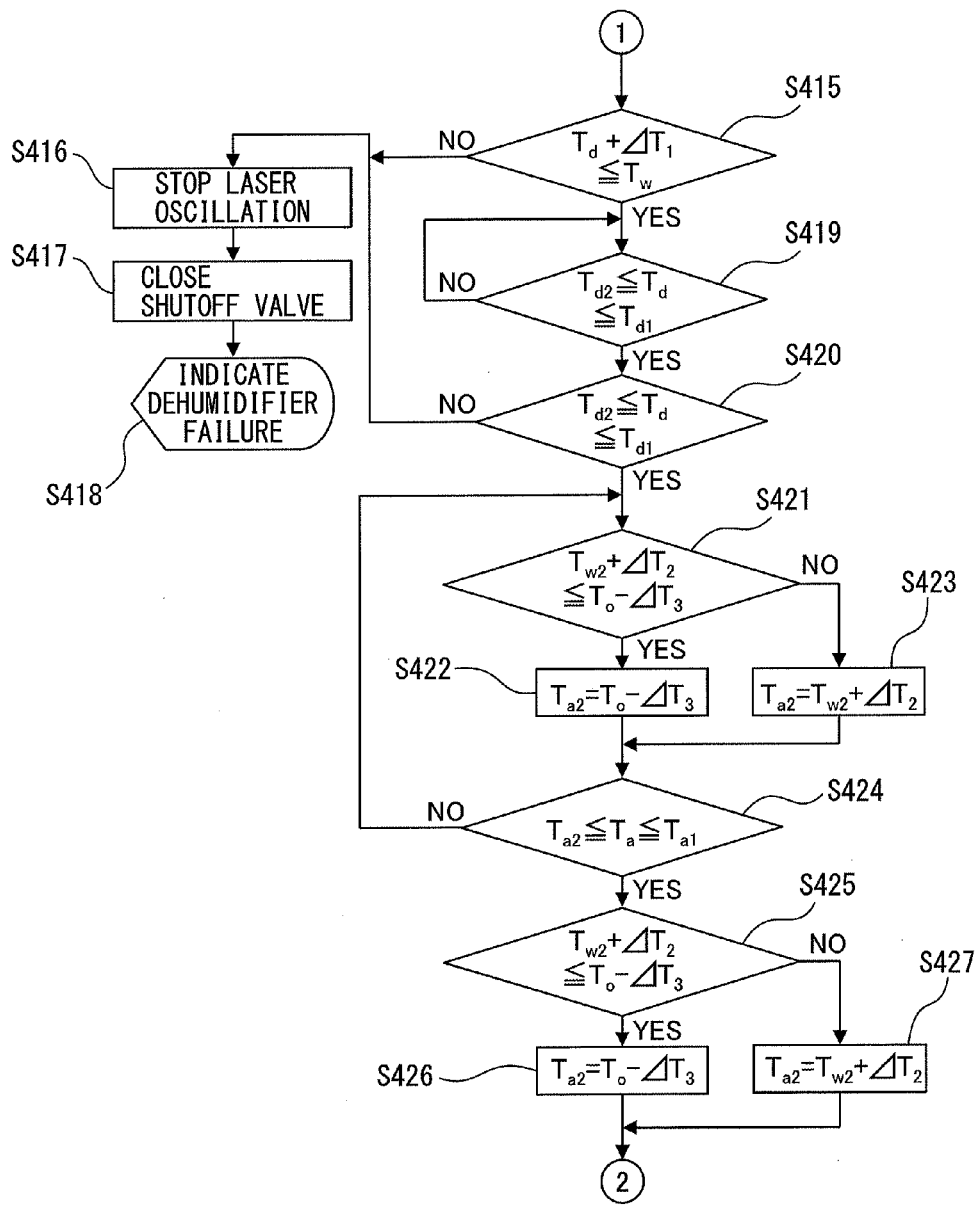
FIG. 15B is a control flowchart for the laser apparatus according to the fifth embodiment.
Figure 15C:
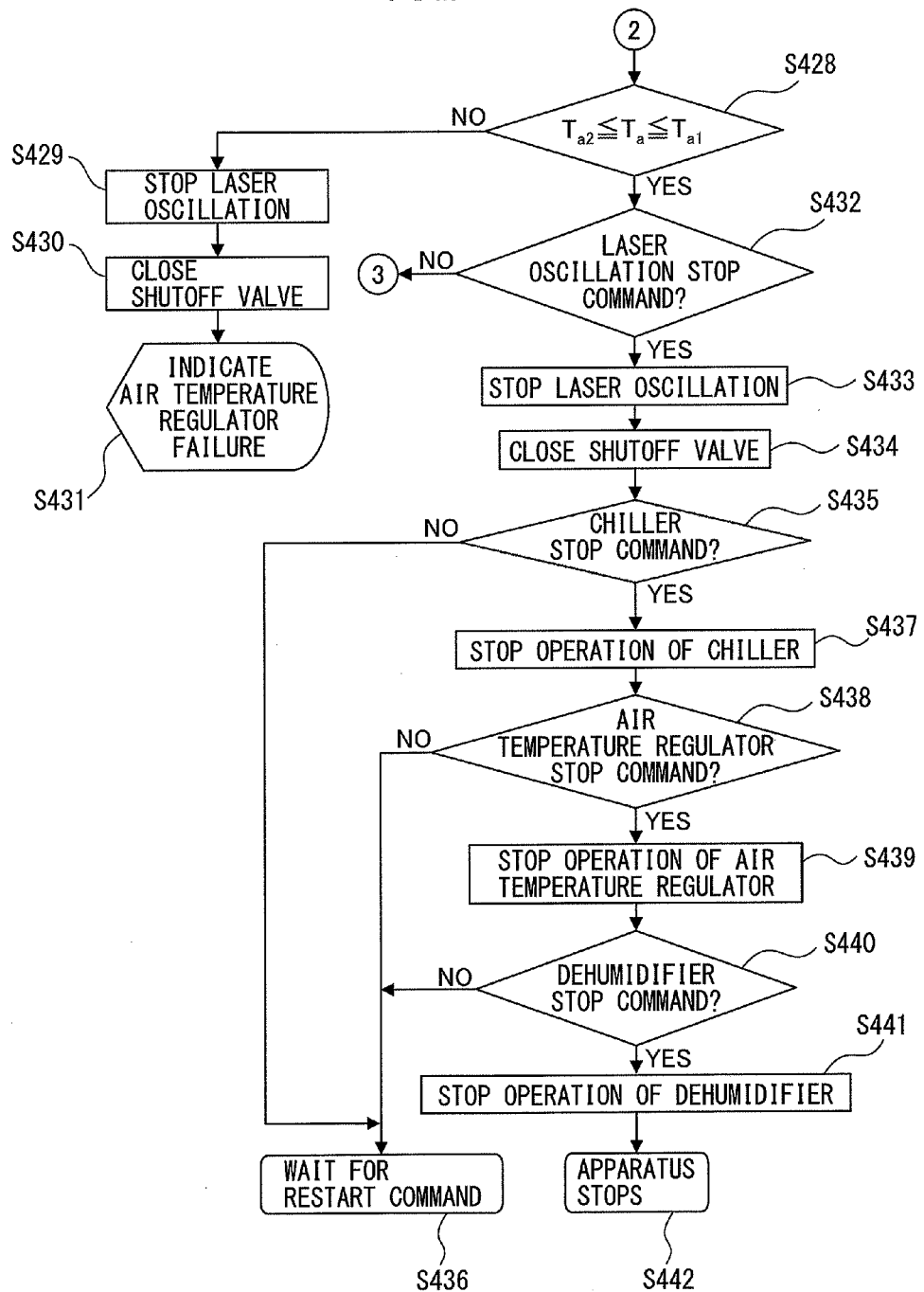
FIG. 15C is a control flowchart for the laser apparatus according to the fifth embodiment.

Laser apparatus 1 according to a fifth embodiment will be described with reference to FIGS. 11 to 15C. FIG. 11 is a schematic diagram showing the configuration of the laser apparatus 1. FIGS. 12 to 14 are control time charts, and FIGS. 15A to 15C are control flowcharts.

Referring to the time charts of FIGS. 12 and 13, the third predetermined temperature range is set so as to vary with time. The lower limit temperature of the third predetermined temperature range is set equal to the temperature obtained by adding the second predetermined temperature difference to the lower limit temperature of the first predetermined temperature range or to the temperature obtained by subtracting a third predetermined temperature difference from the outside air temperature detected by a third temperature detector 23, whichever temperature is higher. The air temperature inside the laser apparatus 1 is controlled to a temperature falling within the third predetermined temperature range or to a temperature not lower than the lower limit temperature of the third predetermined temperature range.

FIG. 12 shows the time chart for the case where the temperature obtained by subtracting the third predetermined temperature difference from the outside air temperature detected by the third temperature detector 23 has at all times been higher than the temperature obtained by adding the second predetermined temperature difference to the lower limit temperature of the first predetermined temperature range. FIG. 13 shows the timing chart for the case where, during the period from time $t_1$ to $t_2$, the temperature obtained by adding the second predetermined temperature difference to the lower limit temperature of the first predetermined temperature range remained higher than the temperature obtained by subtracting the third predetermined temperature difference from the outside air temperature detected by the third temperature detector.

If the temperature of the air inside the laser apparatus 1 needs to be prevented from rising excessively in view of the heat resisting characteristics, etc., of the components contained in the laser apparatus 1, a setting condition for setting the upper limit temperature of the third predetermined temperature range so as not to exceed a certain temperature, for example, may be added, as shown in the time chart of FIG. 14. The second predetermined temperature difference need not necessarily be limited to a positive difference, but it is usually set in the range of about 0 to 5° C. On the other hand, the third predetermined temperature difference is usually a positive temperature difference, for example, in the range of about 5 to 10° C.

Alternatively, in order to prevent excessive condensation from forming on the outside walls of the laser apparatus 1, the laser apparatus 1 may further include a humidity detector for detecting the humidity of the air outside the laser apparatus 1, though not shown in FIG. 11. The computing unit 10 may be configured to calculate the dew point of the air outside the laser apparatus 1 from the humidity of the air outside the laser apparatus 1 and the outside temperature of the laser apparatus 1 detected by the third temperature detector, and the third predetermined temperature difference may be set as a value that varies with the outside environment of the laser apparatus 1 so that the value is given by the relation (third predetermined temperature difference)≈(outside temperature of laser apparatus)−(dew point outside laser apparatus).

According to the fifth embodiment, since the inside air temperature of the laser apparatus 1 is varied with the outside air temperature of the laser apparatus 1, the outside wall temperature of the cabinet 5 of the laser apparatus 1 can be prevented from dropping excessively and forming excessive condensation on the outside walls of the laser apparatus 1. Further, since the temperature of the air inside the laser apparatus 1 is controlled so as not to drop below the lower limit of the first predetermined temperature range, it also becomes possible to prevent the temperature of the air inside the laser apparatus 1 from dropping excessively and the humidity from increasing excessively and forming condensation.

When installing the third temperature detector 23 in a suitable position for detecting the temperature of the cabinet 5, it is desirable to provide a heat insulating structure, for example, by enclosing the third temperature detector 23 with a heat insulating material 26, in order to prevent heat from easily transferring from the air inside the laser apparatus 1, or from any portion of the cabinet 5 of the laser apparatus 1 other than the installation position of the third temperature detector 23, to the installation position so that a temperature as close as possible to the outside air temperature of the laser apparatus 1 can be detected.

In FIGS. 15A to 15C, "$T_w$" is the cooling water temperature, "$T_{w1}$" is the allowable upper limit of the cooling water temperature during the laser oscillation, that is, the upper limit temperature of the first predetermined temperature range, and "$T_{w2}$" is the allowable lower limit of the cooling water temperature during the laser oscillation, that is, the lower limit temperature of the first predetermined temperature range. On the other hand, "$T_d$" is the dew point of the air inside the laser apparatus 1, "$T_{d1}$" is the upper limit temperature of the second predetermined temperature range, and "$T_{d2}$" is the lower limit temperature of the second predetermined temperature range. Further, "$T_a$" is the temperature of the air inside the laser apparatus 1, "$T_{a1}$" is the upper limit temperature of the third predetermined temperature range, and "$T_{a2}$" is the lower limit temperature of the third predetermined temperature range. On the other hand, "$\Delta T_1$" is the first predetermined temperature difference, "$\Delta T_2$" is the second predetermined temperature difference, "$\Delta T_3$" is the third predetermined temperature difference, and "$T_o$" is the outside air temperature of the laser apparatus detected by the third temperature detector.

The flowchart of the fifth embodiment shown in FIGS. 15A to 15C differs from the corresponding flowchart of the third embodiment shown in FIGS. 8A to 8C by the inclusion of steps S421 to S423 and steps S425 to S427.

(Steps S421 to S423)

The temperature obtained by adding the second predetermined temperature difference $\Delta T_2$ to the lower limit temperature $T_{w2}$ of the first predetermined temperature range is compared with the temperature obtained by subtracting the third predetermined temperature difference $\Delta T_3$ from the outside air temperature $T_o$ detected by the third temperature detector 23, and if the temperature obtained by adding the second predetermined temperature difference $\Delta T_2$ to the lower limit temperature $T_{w2}$ of the first predetermined temperature range is lower, the lower limit temperature $T_{a2}$ of the third predetermined temperature range is set equal to the outside air temperature $T_a$ minus the third predetermined temperature difference $\Delta T_3$.

On the other hand, if the temperature obtained by adding the second predetermined temperature difference $\Delta T_2$ to the lower limit temperature $T_{w2}$ of the first predetermined temperature range is higher, the lower limit temperature $T_{a2}$ of the third predetermined temperature range is set equal to the lower limit temperature $T_{w2}$ of the first predetermined temperature range plus the second predetermined temperature difference $\Delta T_2$.

In this way, the third predetermined temperature range is set differently, depending on the result of the comparison made in step S421. Then, if the temperature of the air inside the laser apparatus 1 has deviated outside the third predetermined temperature range after once entering the thus set third predetermined temperature range, it is determined that the air temperature regulator 20 has failed.

Figure 16:
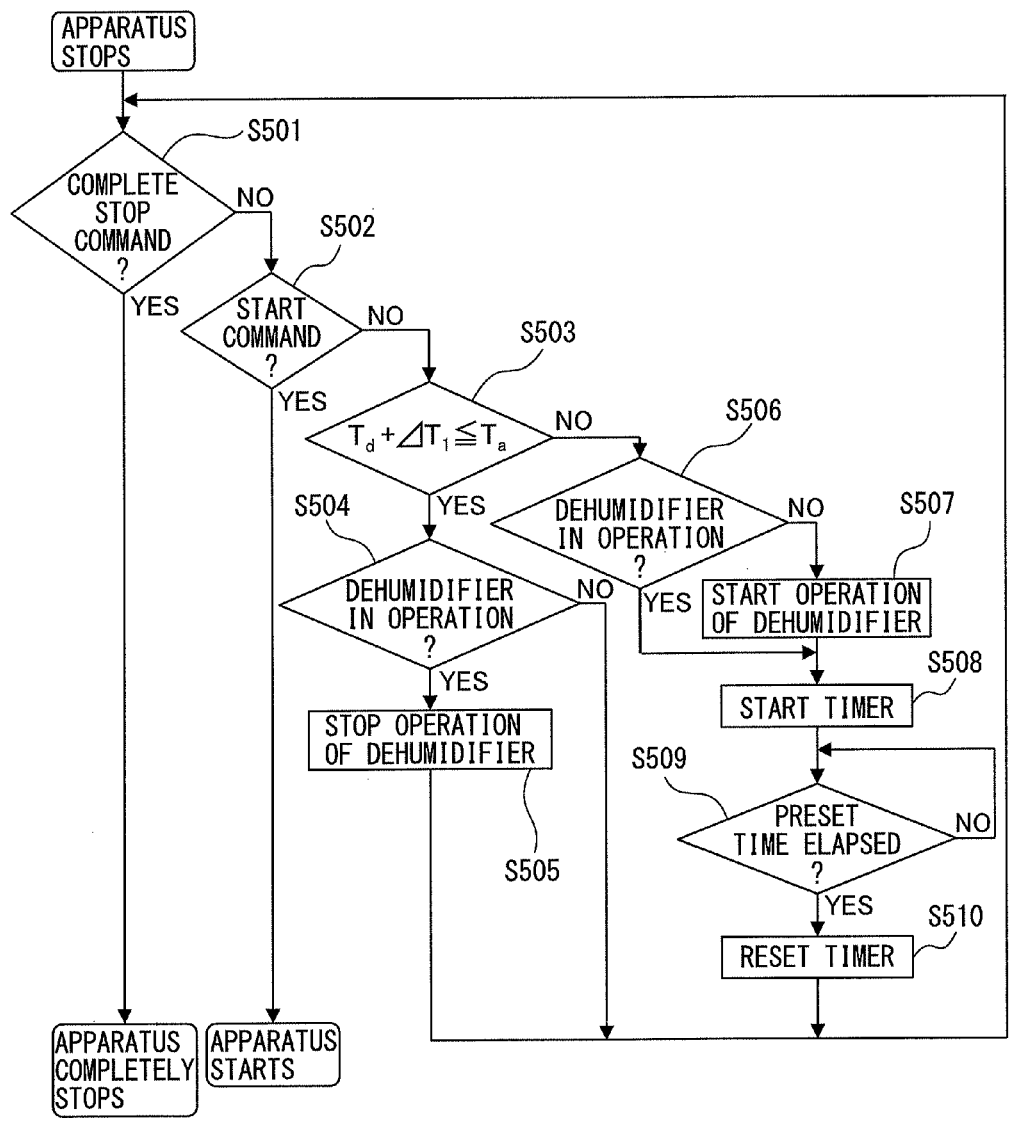
FIG. 16 is a control flowchart for a laser apparatus according to a sixth embodiment.

By referring to the flowchart of FIG. 16, a sixth embodiment will be described. In FIG. 16, "$T_d$" is the dew point of the air inside the laser apparatus 1, "$T_a$" is the temperature of the air inside the laser apparatus 1, and "$\Delta T_1$" is the first predetermined temperature difference. In the control flowcharts shown in FIGS. 3A and 3B, FIGS. 5A and 5B, FIGS. 8A to 8C, and FIGS. 15A to 15C, respectively, after the laser oscillation stop command has been issued, if an operation stop command is issued to the dehumidifier 6, the operation of the dehumidifier 6 is stopped. On the other hand, in the present embodiment, the humidity detector 7, the first temperature detector 8, the computing unit 10, the decision unit 11, and the control unit 12 are each maintained in an operating condition even during the period when the start command is not issued to the laser apparatus 1, except when a complete stop command is issued to the laser apparatus 1, for moving or the like, as shown in FIG. 16.

Then, the humidity and temperature of the air inside the laser apparatus 1 may be monitored at all times or at predetermined intervals of time, and when the temperature obtained by adding the first predetermined temperature difference $\Delta T_1$ to the dew point $T_d$ of the air inside the laser apparatus 1 becomes higher than the temperature $T_a$ of the air inside the laser apparatus 1 detected by the first temperature detector 8, the operation of the dehumidifier 6 may be started automatically to dehumidify the air.

Then, the dehumidifier 6 thus started to operate may control the dew point within the second predetermined temperature range by setting the upper limit temperature of the second predetermined temperature range equal to (the dew point $T_d$ of the air inside the laser apparatus 1 where the operation of the dehumidifier 6 was started)=(the temperature of the air inside the laser apparatus 1 detected by the first temperature detector 8)−(the first predetermined temperature difference $\Delta T_1$).

However, as shown in FIG. 16, if the temperature obtained by adding the first predetermined temperature difference $\Delta T_1$ to the dew point $T_d$ of the air inside the laser apparatus 1 is detected to be higher than the temperature $T_a$ of the air inside the laser apparatus 1 detected by the first temperature detector 8, then after continuously operating the dehumidifier 6 for a predetermined length of time, a decision may be made once again and, if the temperature obtained by adding the first predetermined temperature difference $\Delta T_1$ to the dew point $T_d$ of the air inside the laser apparatus 1 is lower than the temperature $T_a$ of the air inside the laser apparatus 1 detected by the first temperature detector 8, then the operation of the dehumidifier 6 may be stopped.

According to the sixth embodiment, there is offered the effect of being able to prevent condensation from forming inside the laser apparatus 1 even during the period when the laser apparatus 1 is not started.

Figure 17:
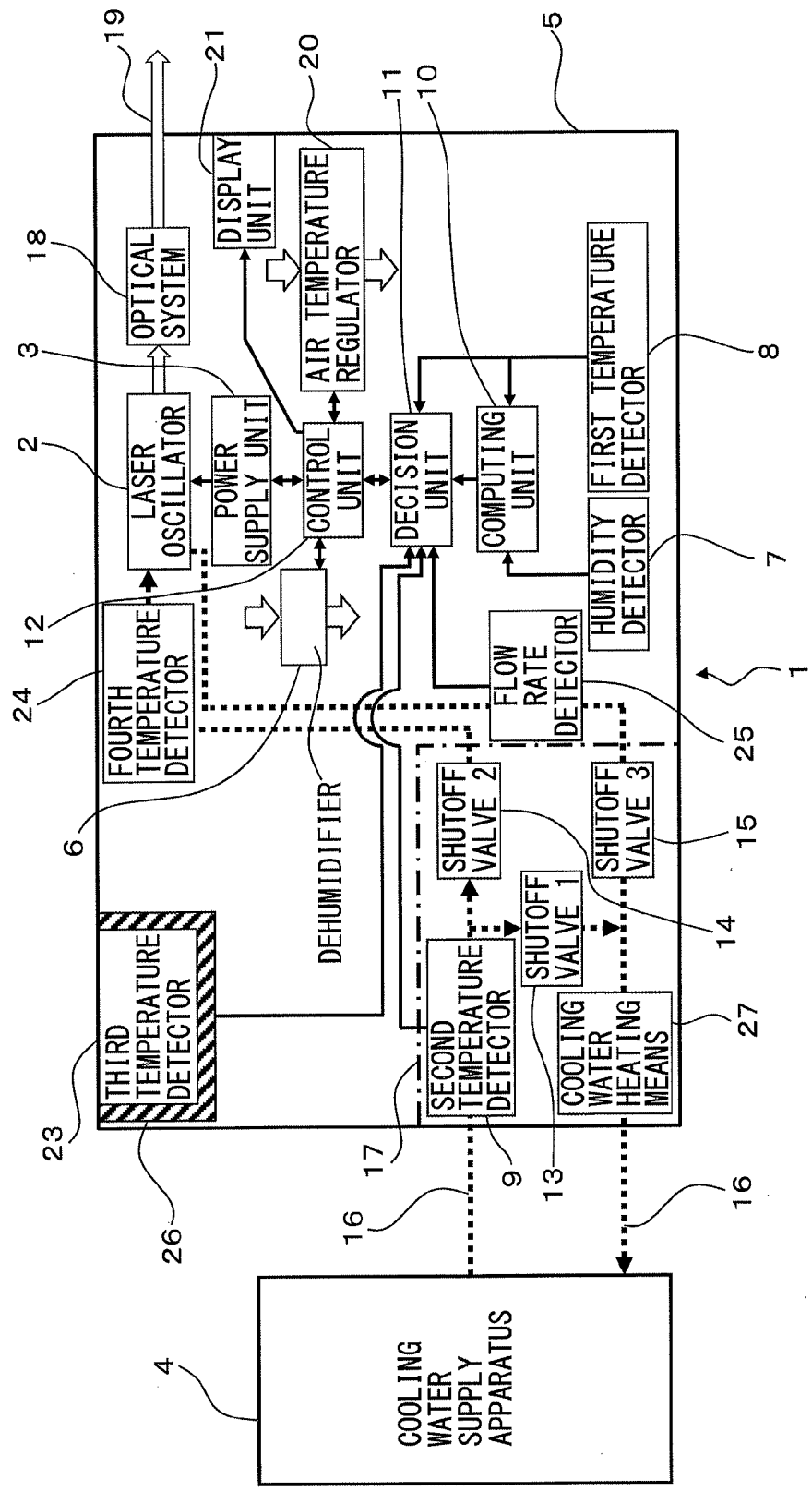
FIG. 17 is a schematic diagram showing the configuration of a laser apparatus according to a seventh embodiment.

Laser apparatus 1 according to a seventh embodiment will be described with reference to FIGS. 17 and 18. FIG. 17 is a schematic diagram showing the configuration of the laser apparatus 1, and FIG. 18 is a control flowchart.

As shown in FIG. 17, the laser apparatus 1 according to the seventh embodiment further includes a fourth temperature detector 24 for detecting the temperature of the cooling water inside the cooling water pipe located upstream of or at substantially the same position as the heat-generating component contained in the laser apparatus 1 or for detecting the temperature of a component member thermally contacting the cooling water pipe located upstream of or at substantially the same position as the heat-generating component contained in the laser apparatus 1.

Figure 18:
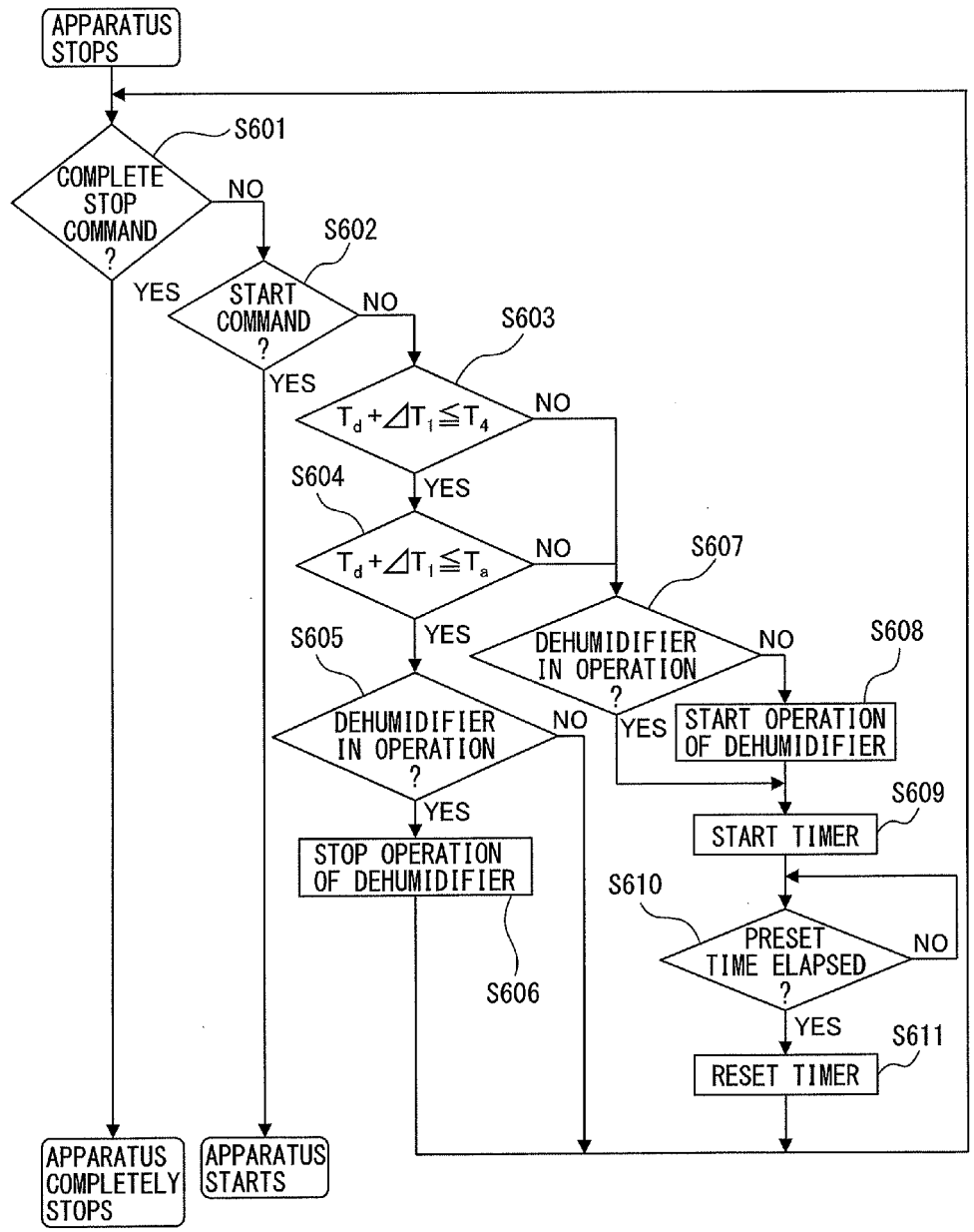
FIG. 18 is a control flowchart for the laser apparatus according to the seventh embodiment.

As shown in FIG. 18, even during the period when the start command is not issued to the laser apparatus 1, except when a complete stop command is issued to the laser apparatus 1, for moving or the like, the temperature obtained by adding the first predetermined temperature difference to the dew point of the air is compared with the temperature detected by the fourth temperature detector 24 and the temperature of the air inside the laser apparatus 1 detected by the first temperature detector 8, and if the obtained temperature is higher than at least one of the detected temperatures, the operation of the dehumidifier 6 is started automatically to dehumidify the air.

In FIG. 18, "$T_d$" is the dew point of the air inside the laser apparatus 1, "$T_a$" is the temperature of the air inside the laser apparatus 1, "$\Delta T_1$" is the first predetermined temperature difference, and "$T_4$" is the temperature detected by the fourth temperature detector 24. Referring to FIG. 18, the condition for stopping the operation of the automatically started dehumidifier 6 is the same as the condition of the sixth embodiment described with reference to FIG. 16.

If the outside air temperature of the laser apparatus 1 rises rapidly, the water temperature rises only slowly because the specific heat of water is high; as a result, if the water is not flowing through the cooling water pipe inside the laser apparatus 1, the portion contacting the water remaining in the pipe, such as the water-cooled plate on which the heat-generating component is mounted, can become the lowest temperature portion inside the laser apparatus 1. By installing the fourth temperature detector 24 in a location expected to become the lowest temperature portion at the time of a rapid temperature rise, and by starting the operation of the dehumidifier 6 when the temperature obtained by adding the first predetermined temperature difference $\Delta T_1$ to the dew point $T_d$ of the air is higher than the temperature $T_4$ detected by the fourth temperature detector 24, condensation inside the laser apparatus 1 can be prevented in a more reliable manner even when the outside air temperature of the laser apparatus 1 rises rapidly during the period when the laser apparatus 1 is not started.

As shown in FIG. 17, the cooling water pipe located nearest to the laser oscillator 2, i.e., the heat-generating source, on the upstream side of the laser oscillator 2, may be chosen as the specific installation location of the fourth temperature detector 24. Alternatively, the fourth temperature detector 24 may be installed on a portion cooling the laser oscillator 2, or in the case of a laser apparatus that uses a laser diode module as a laser light source or pumping light source, the fourth temperature detector 24 may be configured to detect the temperature of the water-cooled plate on which, the laser diode module is mounted.

When the fourth temperature detector 24 is configured to detect the temperature of the water-cooled plate, the advantage is that it becomes possible to verify, prior to the start of laser oscillation, whether the cooling water is flowing and the water-cooled plate is actually cooled to a desired temperature, and also verify, during the laser oscillation, whether the temperature of the water-cooled plate is reduced to the desired temperature.

If the cooling water temperature is normal, the water-cooled plate may not be cooled to the desired temperature because the flow rate of the cooling water falls short of the required rate; to detect such a failure mode, a flow rate detector 25 may be provided on the downstream side of the cooling water pipe, as shown in FIG. 17, and an indication indicating a low cooling water flow rate or a chiller failure may be displayed on the display unit when the flow rate of the cooling water does not lie within a predetermined flow rate range.

A plurality of either or both of such cooling water supply apparatuses and dehumidifiers may be provided for one laser apparatus. In that case, if one of the cooling water supply apparatuses or dehumidifiers has failed, the cooling water temperature and the dew point of the air inside the laser apparatus 1 can still be controlled within the first predetermined temperature range and the second predetermined temperature range, respectively. According to the above-described embodiment, the laser oscillation need not be stopped in order to prevent condensation, as long as no failure occurs in the cooling water supply apparatus or the humidifier.

Further, in the case of the laser apparatus provided with a plurality of cooling water supply apparatuses and dehumidifiers, if one of the cooling water supply apparatuses or dehumidifiers fails, there is no need to stop the laser oscillation, and the chance of incurring a situation in which the laser oscillation has to be stopped can be reduced.

While various embodiments of the present invention have been described above, those skilled in the art will recognize that the effects and advantages intended by the present invention can also be achieved by other embodiments. In particular, it is possible to omit or replace some of the component elements of the above embodiments or add some known means thereto without departing from the scope of the invention. It is also apparent to those skilled in the art that the invention can also be carried out by suitably combining the features of a plurality of embodiments explicitly or implicitly disclosed in this patent specification.

According to the laser apparatus of the first invention, since the dew point in a closed space does not change with air temperature unless the air is dehumidified or is humidified from the outside, once the relation of (dew point)+(first predetermined temperature difference)≤(cooling water temperature) holds, and once the cooling water temperature is controlled within the first predetermined temperature range, the relation continues to hold and condensation does not occur, provided that the dehumidifying capacity of the dehumidifier exceeds the amount of moisture that can infiltrate through openings in the cabinet, unless the operation of the dehumidifier is stopped for such reasons as a decrease in the inside air temperature of the cabinet. Since condensation does not occur, there is no need to stop the laser oscillation or the supply of the cooling water in order to prevent condensation or provide protection against condensation.

According to the laser apparatus of the second invention, once the relation (dew point)+(first predetermined temperature difference)≤(cooling water temperature) holds, since the cooling water temperature is controlled within the first predetermined temperature range, the relation continues to hold and condensation does not occur, provided that the dehumidifying capacity of the dehumidifier exceeds the amount of moisture that can infiltrate through openings in the cabinet, unless the operation of the dehumidifier is stopped for such reasons as a decrease in the inside air temperature of the cabinet.

According to the laser apparatus of the third invention, not only can condensation be prevented in a reliable manner but, in the case of a dehumidifier using a compressor, the compressor can also be prevented from deteriorating due to on/off operations.

According to the laser apparatus of the fourth invention, the power consumption of the dehumidifier can be reduced. Furthermore, if the dehumidifier is controlled by inverter control or like method that reduces the load on the dehumidifier, the driving time of the dehumidifier can be reduced, which serves to preserve its service life.

According to the laser apparatus of the fifth invention, while generally a dehumidifier having a high dehumidifying capacity has an attendant effect of cooling air, the invention can prevent air temperature from dropping excessively and causing the humidity inside the laser apparatus to rise; furthermore, when the ambient temperature rises, the temperature of the air inside the laser apparatus can be prevented from rising, while preserving the dehumidifying function.

According to the laser apparatus of the sixth invention, condensation can be prevented reliably without having to provide the dehumidifier and the air temperature regulator separately, and the size and cost of the laser apparatus can be reduced.

According to the laser apparatus of the seventh or eighth invention, the humidity inside the laser apparatus can be prevented from increasing excessively and causing condensation, while preventing the outside wall temperature of the cabinet of the laser apparatus from dropping excessively and forming excessive condensation on the outside walls of the laser apparatus.

According to the laser apparatus of the ninth invention, except when there is a need to completely stop the operation of the laser apparatus for moving or the like, the dew point and temperature of the air inside the laser apparatus are monitored, and the dehumidifier is operated so that the temperature obtained by adding the first predetermined temperature difference to the dew point does not become higher than the inside air temperature of the laser apparatus; in this way, condensation can be prevented from forming inside the laser apparatus even during the period when the laser apparatus is not started.

According to the laser apparatus of the tenth invention, the fourth temperature detector is installed in a location expected to become the lowest temperature portion when the temperature of the air inside the laser apparatus rises with a rise in the outside air temperature of the laser apparatus, and the operation of the dehumidifier is started when the temperature obtained by adding the first predetermined temperature difference to the dew point of the air becomes higher than the temperature detected by the fourth temperature detector; with this arrangement, condensation inside the laser apparatus can be prevented in a more reliable manner even when the temperature of the air outside the laser apparatus rises rapidly and air with a high dew point is introduced into the laser apparatus during the period when the laser apparatus is not started.

What is claimed is:

1. A laser apparatus which includes a laser oscillator and a power supply unit for supplying a driving current to the laser oscillator, and which is configured so that cooling water for cooling a heat-generating component contained in the laser apparatus is supplied from a cooling water supply apparatus provided outside the laser apparatus, wherein
the laser apparatus comprises:
a cabinet having hermeticity to reduce the amount of air infiltrating from outside the laser apparatus into an interior of the laser apparatus to a level not higher than a predetermined value;
a dehumidifier which dehumidifies air inside the laser apparatus;
a humidity detector which detects humidity of the air inside the laser apparatus;
a first temperature detector which detects temperature of the air inside the laser apparatus;
a second temperature detector which detects temperature of the cooling water supplied from outside the laser apparatus;
a computing unit which computes dew point of the air inside the laser apparatus from detection results supplied from the humidity detector and the first temperature detector;
a decision unit which makes a decision, based on the detection result from the second temperature detector and the dew point computed by the computing unit, as to whether a flow start condition for starting to flow the cooling water into the interior of the laser apparatus or an oscillation start condition for causing the laser oscillator to start laser oscillation by supplying the driving current from the power supply unit to the laser oscillator has been satisfied or not; and
a control unit which, based on the result of the decision made by the decision unit, controls the opening and closing of a shutoff valve provided in a pipe through which the cooling water supplied from the cooling water supply apparatus flows, or controls the supply of the driving current from the power supply unit to the laser oscillator, and wherein
the control unit is configured so that when it is decided by the decision unit that a relation (dew point)+(first predetermined temperature difference)≤(cooling water temperature) and a relation (first limit of cooling water temperature during laser oscillation)≤(cooling water temperature)≤(second limit of cooling water temperature during laser oscillation) are both satisfied as a result of a comparison between the dew point computed by the computing unit and the cooling water temperature detected by the second temperature detector, the shutoff valve provided in the pipe is opened to start to flow the cooling water into the interior of the laser apparatus and, after that the driving current is supplied to the laser oscillator to start laser oscillation, and
the cooling water supply apparatus is configured to continue to supply the cooling water during the laser oscillation, the cooling water being controlled within a first predetermined temperature range defined between the first limit of the cooling water temperature during the laser oscillation and the second limit of the cooling water temperature during the laser oscillation, while the dehumidifier is configured to continue to dehumidify the air during the laser oscillation so that the relation of (dew point)+(first predetermined temperature difference)≤(cooling water temperature) is maintained.

2. The laser apparatus according to claim 1, wherein the dehumidifier has a dehumidifying capacity exceeding a maximum amount of moisture per unit time that can infiltrate from outside the laser apparatus into the interior of the laser apparatus, the maximum amount being estimated from an environmental condition of the laser apparatus and the hermeticity provided by the cabinet to reduce the amount of air infiltrating from outside the laser apparatus into the interior of the laser apparatus to a level not higher than the predetermined value.

3. The laser apparatus according to claim 1, wherein the dehumidifier is configured to continue to dehumidify the air during a period that the cooling water is being supplied from the cooling water supply apparatus into the interior of the laser apparatus.

4. The laser apparatus according to claim 1, wherein the dehumidifier is controlled so that the dew point of the air inside the laser apparatus lies within a second predetermined temperature range which is lower than the first predetermined temperature range, and so that the dew point, once brought into the second predetermined temperature range, will not deviate outside the second predetermined temperature range.

5. The laser apparatus according to claim 1, further comprising an air temperature regulator for regulating the temperature of the air inside the laser apparatus, and wherein
in accordance with a command from the control unit, the temperature of the air inside the laser apparatus detected by the first temperature detector is controlled by the air temperature regulator so as to lie within a third predetermined temperature range whose lower limit temperature value is set approximately equal to a lower limit temperature of the first predetermined temperature range or set higher than the lower limit temperature of the first predetermined temperature range, and
once the temperature of the air inside the laser apparatus is brought into the third predetermined temperature range, the temperature of the air inside the laser apparatus is controlled so as not to deviate outside the third predetermined temperature range.

6. The laser apparatus according to claim 5, wherein the dehumidifier is of a type that cools the air flowing into the dehumidifier to a temperature equal to or below the dew point and dehumidifies the air by causing condensation on a condensing unit contained in the dehumidifier, and
the laser apparatus further includes a heating unit for heating the air flowing out of the dehumidifier, and wherein
the heating unit is controlled by the control unit so as to apply substantially minimum heating necessary to prevent the temperature of the air inside the laser apparatus from dropping below the lower limit temperature of the third predetermined temperature range.

7. The laser apparatus according to claim 5, wherein the temperature of the air inside the laser apparatus is controlled by the air temperature regulator to a temperature within the third predetermined temperature range or to a temperature not lower than the lower limit temperature of the third predetermined temperature range, and
the laser apparatus further includes a third temperature detector for detecting an outside temperature of the laser apparatus or temperature of the cabinet, and wherein
the third predetermined temperature range is set as a time-varying condition, and the lower limit temperature of the third predetermined temperature range is set equal to a temperature obtained by adding a second predetermined temperature difference to the lower limit temperature of the first predetermined temperature range or to a temperature obtained by subtracting a third predetermined temperature difference from the temperature detected by the third temperature detector, whichever temperature is higher, and air temperature inside the laser apparatus is controlled to a temperature falling within the third predetermined temperature range or to a temperature not lower than the lower limit temperature of the third predetermined temperature range.

8. The laser apparatus according to claim 6, wherein the temperature of the air inside the laser apparatus is controlled by the heating unit to a temperature within the third predetermined temperature range or to a temperature not lower than the lower limit temperature of the third predetermined temperature range, and the laser apparatus further includes a third temperature detector for detecting an outside temperature of the laser apparatus or temperature of the cabinet, and wherein the third predetermined temperature range is set as a time-varying condition, and the lower limit temperature of the third predetermined temperature range is set equal to a temperature obtained by adding a second predetermined temperature difference to the lower limit temperature of the first predetermined temperature range or to a temperature obtained by subtracting a third predetermined temperature difference from the temperature detected by the third temperature detector, whichever temperature is higher, and air temperature inside the laser apparatus is controlled to a temperature falling within the third predetermined temperature range or to a temperature not lower than the lower limit temperature of the third predetermined temperature range.

9. The laser apparatus according to claim 1, wherein even during a period when a start command is not issued to the laser apparatus, except when a complete stop command is issued to the laser apparatus, the humidity and temperature of the air inside the laser apparatus are monitored at all times or at predetermined intervals of time by the humidity detector, the first temperature detector, the computing unit, the decision unit, and the control unit, and when the temperature obtained by adding the first predetermined temperature difference to the dew point of the air inside the laser apparatus becomes higher than the temperature of the air inside the laser apparatus detected by the first temperature detector, operation of the dehumidifier is started automatically to dehumidify the air.

10. The laser apparatus according to claim 1, further comprising a fourth temperature detector for detecting the temperature of the cooling water inside the pipe located upstream of or at substantially the same position as the heat-generating component or for detecting temperature of a component member thermally contacting the pipe located upstream of or at substantially the same position as the heat-generating component, and wherein even during a period when a start command is not issued to the laser apparatus, except when a complete stop command is issued to the laser apparatus, the temperature obtained by adding the first predetermined temperature difference to the dew point of the air is compared with the temperature detected by the fourth temperature detector and the temperature of the air inside the laser apparatus detected by the first temperature detector, and if the obtained temperature is higher than at least one of the detected temperatures, operation of the dehumidifier is started automatically to dehumidify the air.

* * * * *